(12) United States Patent
Matsutori et al.

(10) Patent No.: US 7,357,257 B2
(45) Date of Patent: Apr. 15, 2008

(54) THIN PLATE SUPPORTING CONTAINER

(75) Inventors: Chiaki Matsutori, Shisui-machi (JP); Tadahiro Obayashi, Shisui-machi (JP)

(73) Assignee: Miraial Co., Ltd. (JP)

( * ) Notice: Subject to any disclaimer, the term of this patent is extended or adjusted under 35 U.S.C. 154(b) by 0 days.

(21) Appl. No.: 11/476,075

(22) Filed: Jun. 28, 2006

(65) Prior Publication Data
US 2006/0272966 A1 Dec. 7, 2006

Related U.S. Application Data

(62) Division of application No. 10/725,288, filed on Dec. 2, 2003.

(30) Foreign Application Priority Data
Dec. 27, 2002 (JP) ............................. 2002-379340

(51) Int. Cl.
*B65D 85/30* (2006.01)
(52) U.S. Cl. .................... 206/710; 206/711; 206/454
(58) Field of Classification Search ............... 206/454, 206/710, 711, 832, 455, 445, 307.1; 211/41.18
See application file for complete search history.

(56) References Cited

U.S. PATENT DOCUMENTS

| | | | | |
|---|---|---|---|---|
| 5,445,271 A * | 8/1995 | Kakizaki et al. | ......... | 206/459.5 |
| 5,555,981 A | 9/1996 | Gregerson | .................. | 206/711 |
| 5,722,707 A | 3/1998 | Hosoi | ........................ | 292/258 |
| 5,992,638 A | 11/1999 | Gregerson et al. | .......... | 206/711 |
| 6,010,008 A * | 1/2000 | Nyseth et al. | .............. | 206/711 |
| 6,039,186 A | 3/2000 | Bhatt et al. | | |
| 6,382,419 B1 * | 5/2002 | Fujimori et al. | ............ | 206/454 |
| 6,398,033 B1 * | 6/2002 | Wu et al. | ................... | 206/711 |
| 6,428,729 B1 | 8/2002 | Bhatt et al. | ................. | 264/254 |
| 6,446,806 B1 | 9/2002 | Ohori et al. | ................. | 206/454 |
| 6,491,177 B1 | 12/2002 | Hyobu | ..................... | 220/4.01 |
| 6,682,797 B1 | 1/2004 | Otoi et al. | .............. | 428/36.92 |
| 2001/0040116 A1 * | 11/2001 | Hyobu et al. | ................ | 206/711 |
| 2002/0020650 A1 * | 2/2002 | Fujimori et al. | ............ | 206/454 |
| 2002/0038773 A1 * | 4/2002 | Fujimori et al. | ............ | 206/454 |
| 2002/0114686 A1 * | 8/2002 | Glynn et al. | ................ | 414/292 |

FOREIGN PATENT DOCUMENTS

| | | |
|---|---|---|
| DE | 19848147 A1 | 4/1999 |
| EP | 1 004 524 A1 | 5/2000 |
| EP | 1004524 A1 | 5/2000 |
| GB | 2324413 | 10/1998 |

(Continued)

Primary Examiner—J. Gregory Pickett
(74) Attorney, Agent, or Firm—Bacon & Thomas, PLLC

(57) ABSTRACT

A thin plate supporting container includes a container body for housing therein semiconductor wafers, a lid unit for closing the container body, and slotted plates for supporting the semiconductor wafers from opposing sides. There are provided an upper fitting portion for supporting an upper portion of the slotted plate, and a lower fitting portion for supporting a lower portion of the slotted plate. An upper fitting piece of the upper fitting portion has a planar contact face which comes into contact with the slotted plate to thereby position the slotted plate in the front/rear direction while suppressing swing of the slotted plate. The upper receiving element on the slotted plate has a planar contact face. The lower fitting portion provides vertical, horizontal and front/rear positioning.

10 Claims, 22 Drawing Sheets

FOREIGN PATENT DOCUMENTS

| | | |
|---|---|---|
| GB | 2338924 A | 1/2000 |
| JP | 09-045759 | 2/1997 |
| JP | 10-189704 | 7/1998 |
| JP | 11-026566 | 1/1999 |
| JP | 11-168136 | 6/1999 |
| JP | 11-189288 | 7/1999 |
| JP | 2000-043976 | 2/2000 |
| JP | 2000-91409 | 3/2000 |
| JP | 2000-159288 | 6/2000 |
| JP | 2000-323560 | 11/2000 |
| JP | 2002-353299 | 12/2002 |
| JP | 2002-353301 | 12/2002 |
| WO | WO 98/59229 | 12/1998 |
| WO | 99/39994 | 12/1999 |
| WO | WO 02/47118 | 6/2002 |

\* cited by examiner

THIN PLATE SUPPORTING CONTAINER

CROSS-REFERENCE TO RELATED APPLICATION

This application is a divisional of U.S. application Ser. No. 10/725,288 filed 2 Dec. 2003 and claims, under 35 USC 119, priority of Japanese Application No. 2002-379340 filed on Dec. 27, 2002.

BACKGROUND OF THE INVENTION

1. Field of the Invention

The present invention relates to a thin plate supporting container for housing, storing, and transporting thin plates such as semiconductor wafers, storage disks, or liquid crystal glass substrates.

2. Related Background Art

A thin plate supporting container is generally constructed by a container body and a lid unit for closing the upper opening of the container body. In the container body, slotted plates are provided on opposite side walls, and a plurality of thin plates such as semiconductor wafers are supported between the slotted plates.

The slotted plates are detachably supported in the container body. Specifically, a supporting hole is provided in the slotted plate side and a supporting projection is provided on the container body. By the mating of the supporting hole and the supporting projection, the slotted plates are detachably supported in the container body As disclosed, for example, in International Publication WO99/39994 wherein sets, each consisting of the supporting hole and the supporting projection, are provided in three positions. Since sets of the supporting hole and the supporting projection are provided in three positions, the slotted plate is not deflected. Provision of sets in only two positions, i.e. at opposing ends of the slotted plate is also possible. In this latter case, however, since the supporting hole and the supporting projection have a circular shape and can rotate in a state where they are fitted with each other, the slotted plates may be deflected.

Further, since the slotted plate is positioned by the supporting hole and the supporting projection, the deepest portion of the slotted plate may slightly deviate. When the thin plate supporting container is disposed longitudinally, semiconductor wafers are supported in the deep portions of the slotted plates and, if there is a positional deviation in the deep portions of the slotted plates, the positions of semiconductor wafers will deviate in the thin plate supporting container.

A plurality of plate segments forming the slotted plate curve along the periphery of a semiconductor wafer close to an inlet/outlet port. Because the inlet/outlet port side of a plate piece extends toward the semiconductor wafer, there is a high possibility that a semiconductor wafer supplied/taken out will come into contact with the plate segment. To solve the problem, the inlet/outlet port side of the plate piece must be widened toward the container body. In this case, however, the semiconductor wafer supporting positions are at the innermost end and at an intermediate position. There is no support near the inlet/outlet port, so that the support is unstable.

Between the semiconductor wafers and the bottom of the thin plate supporting container, a sufficient gap is provided to prevent the semiconductor wafers from coming into contact with the bottom in case of an abnormal shock, in the case of a fall or the like. To provide such a gap, however, the thin plate supporting container must be taller. When the thin plate supporting container is packed in a box, the gap between the bottom of the box and the bottom of the thin plate supporting container is small. Accordingly, the amount of cushioning which can be put between the bottom of the box and the bottom of the thin plate container is small. Although there is no problem in normal transportation, in case of an abnormal shock due to a fall or the like, the small amount of the cushioning poses a problem. It is preferable that the amount of cushioning be larger.

A top flange and a handle are detachably attached to the thin plate supporting container. When a strong external force tending to pull off the top flange or handle is created by an abnormal shock due to fall of the thin plate supporting container or the like, there is the possibility that a locking pawl or the like will come off and the top flange will detach.

There is also the possibility that a known latch mechanism for fixing a lid unit to the container body will be caught by the container body when the latch mechanism is unlatched to detach the lid unit.

On the interior side of the lid unit, a thin plate pressing member is provided. Fitting grooves are formed in the thin plate pressing member. Semiconductor wafers are fitted into the fitting grooves and thereby individually supported. The fitting groove is formed in a V shape, the angle of the V-shaped fitting groove is usually an obtuse angle, and the periphery of a semiconductor wafer is lightly caught in the fitting groove. Although there is no problem in normal use, an abnormal shock may cause the semiconductor wafers to turn or be displaced.

The thin plate pressing member is formed of a number of pressing bands disposed in parallel for supporting the semiconductor wafers separately at predetermined intervals, with the periphery of a semiconductor wafer supported by being fit in a fitting groove formed in the pressing band. In this case, if a semiconductor wafer comes out of the fitting groove in the pressing band, the semiconductor wafer may enter a gap between the pressing bands.

On the bottom of the container body are transversely oriented positioning means for positioning the thin plate supporting container. The positioning means is constructed by three fitting grooves provided at almost equal intervals. When positioning projections on a base stand side lodge in the fitting grooves, the container body is accurately positioned. Since the fitting grooves are made of the same material as that of the thin plate supporting container, in entering the fitting grooves, the positioning projections do not slide smoothly. There is the possibility that the positioning projection will stop midway in the fitting groove and accurate positioning will not be achieved.

SUMMARY OF THE INVENTION

Accordingly, the present invention has, as its object, provision of a thin plate supporting container capable of accurately, reliably, and stably supporting a thin plate, to/from which a lid unit and the like can be attached/detached reliably and easily, and which can be accurately positioned.

According to a first aspect of the invention, there is provided a thin plate supporting container comprising a container body for housing therein a plurality of thin plates, a lid unit for closing the container body, slotted plates provided on side walls facing each other in the container body for supporting the thin plates housed on the inside from both sides, upper fitting means for attaching an upper portion of the slotted plate to the container body, and a lower fitting means for attaching a lower portion of the slotted plate to the container body. The upper fitting means includes upper fitting lugs provided at least at both sides of each of the side walls facing each other in the container body, and an upper receiving element, i.e. an elongated bracket provided, in a position facing the upper fitting lugs, on the slotted plate. The upper fitting lugs each have a contact face having a flat planar shape and which engage the elongated bracket on the slotted plate to thereby position the slotted plate in the front/rear direction and prevent swinging of the slotted plate.

According to a second aspect of the invention, there is provided a thin plate supporting container comprising a container body for housing therein a plurality of thin plates, a lid unit for closing the container body, slotted plates provided on side walls facing each other in the container body for supporting the housed thin plates from both sides, upper fitting means for supporting an upper portion of the slotted plate on the container body, and lower fitting means for supporting a lower portion of the slotted plate on the container body, wherein the lower fitting means includes vertical positioning means for positioning the slotted plate in the vertical direction, horizontal positioning means for positioning the slotted plate in the horizontal direction, and front/rear positioning means for positioning the slotted plate in the front/rear direction. In cooperation with the upper fitting means, the slotted plate can be accurately positioned and fixed.

The vertical-direction positioning means includes vertical-direction supporting elements (brackets) provided in a lower portion of each of side walls facing each other in the container body which mate with a lower end of the slotted plate, thereby accurately positioning the slotted plate in the vertical direction.

The horizontal-direction positioning means includes a notch formed in a lower edge of the slotted plate, and a horizontal positioning projection provided in a lower portion of each of side walls facing each other in the container body, which projection fits within the notch in the lower edge of the slotted plate for horizontal positioning of the slotted plate.

The front/rear positioning means has a front/rear supporting element which extends from the lower portion of the front of the slotted plate to the back side of the slotted plate where it contacts a side wall face of the container body, thereby positioning the slotted plate in the front/rear direction.

A stopper for locking the slotted plate to the container body is provided at the lower portion of the slotted plate.

According to another aspect of the invention, there is provided a thin plate supporting container comprising a container body for housing therein a plurality of thin plates, a lid unit for closing the container body, and slotted plates provided on side walls facing each other in the container body and supporting the housed thin plates from opposing sides, wherein the slotted plate is formed of a plurality of plate elements for individually supporting the thin plates. The plate elements extend from an inner side of the container body to an outlet/inlet port and each, from its innermost end to an intermediate position, is curved along the periphery of the thin plate and, from the intermediate position to the outlet/inlet port extends along the container body. On the innermost end and the outlet/inlet end of each plate element, is a thin plate supporting projection for supporting the thin plates. The thin plate supporting projection on the outlet/inlet port side is provided at the point of intersection of the inner edge of the plate element and the periphery of the thin plate.

According to yet another aspect of the invention, there is provided a thin plate supporting container comprising a container body for housing therein a plurality of thin plates, a lid unit for closing the container body, and slotted plates provided on side walls facing each other in the container body and supporting the housed thin plates from opposing sides, wherein a gasket is provided between the lid unit and the container body, the gasket having a base end supporting portion fit in the lid unit side or container body side, and a contact portion extending from the base end supporting portion and formed into a flange shape, with an intermediate portion extending upward, and an outer periphery folded downward. The intermediate portion is pressed against the lid unit or the body when the container body is closed by the lid unit, thereby making the periphery closely sealed to the container body by elastic force of the contact portion. Consequently, even when the gasket is deflected, the seal of periphery of the container body to the lid unit side can be maintained with reliability.

The base end supporting portion of the gasket serves as a seal piece in contact with the lid unit or container body. An annular groove may provided in the seal piece for absorbing elastic deformation of the seal piece. A gap between the bottom plate (wall) of the container body and the lower end of the thin plates housed in the container body is preferably set at the minimum sufficient to absorb shock.

With the above-described structure, since the gap between the bottom plate of the container body and the lower periphery of the thin plate housed in the container body is set at the minimum to absorb shock, the size of the container body can be reduced.

Accordingly, since the height of the container body is reduced by an amount corresponding to reduction in the gap between the bottom plate of the container body and the lower end of the thin plates housed in the container body, the size of the thin plate supporting container can be reduced. Consequently, when packed, cushioning between the bottom of the thin plate supporting container and a packing box can be increased, and the impact absorbing capability in the case of an impact of a fall can be largely increased.

According to another aspect of the invention, there is provided a thin plate supporting container comprising a container body for housing therein a plurality of thin plates, a lid unit for closing the container body, and slotted plates provided on side walls facing each other in the container body and supporting the housed thin plates fromopposing sides, wherein an attaching/detaching mechanism is provided for detachably attaching either or both of a top flange for engagement by a carrying mechanism and a handle to be held by the user, to the container body. The attaching/detaching mechanism has a sliding and supporting means for slidably engaging the container body with the top flange or handle so that the two members are slidable relative to each other, and locking means for locking the two members. The sliding and supporting means includes a supporting portion provided on one of members and a sliding portion which is provided on the other member for insertion into the supporting portion from the front side to the inner side. The locking means has a locking projection provided on one of the members, and a locking pawl provided on the other member for engaging the locking projection. A supporting bar supports a contact and extends to the front side of the sliding and supporting means. The contact carried by the support bar on the one member engages a locking projection on the other member to prevent disengagement of the top flange or handle. Thus, even if a strong impact is given to the top flange or the handle, the top flange or the handle does not come off.

The contact of the locking pawl is preferably provided at the digital end, opposite the base end portion of the supporting bar so that the contact is strongly pressed against the locking projection. Consequently, even if a strong force is applied by an impact or the like, the contact does not release from the locking projection.

In yet another aspect of the invention, two supporting portions and two sliding portions of the sliding and supporting means are provided in parallel, and each of the interval between the supporting portions and the interval between the sliding portions is set to be small on the front side and larger on the inner side, so that the sliding portion can be easily fit in the supporting portion.

The thin plate supporting container may further include guide rails for guiding two members supported by the sliding and supporting means for sliding and positioning in a direction orthogonal to the sliding direction, whereby the two members supported by the sliding and supporting means can be easily attached/detached.

According to still another aspect of the invention, there is provided a thin plate supporting container comprising a container body for housing therein a plurality of thin plates, a lid unit for closing the container body, and slotted plates provided on side walls facing each other in the container body and supporting the housed thin plates from opposing sides, wherein the lid unit is provided with a latch mechanism for fixing the lid unit to the container body, the latch mechanism including a first arm for engagement with the container body to fix the lid unit to the container body, and a second arm swingably supported by the lid unit and swingably supporting the first arm. The first arm has a locking pawl at a base end portion for engaging the container body, and a grip which is positioned at a side of the lid unit for lifting when the first and second arms swing to their limit positions where the locking pawl at the base end of the first arm is not in contact with the container body.

To attach the lid unit to the container body, the user grips the grips of the first arms to lift the lid unit and covers the container body with the lid unit. The grips are positioned to the sides of the lid with the first and second arms swung to their limit positions, so that the user can easily lift the lid unit and cover the container body with the lid unit. The grips are then pushed downward to bring the locking pawl at the base end of each first arm into contact with the container body, thereby fixing the lid unit to the container body. To detach the lid unit from the container body, the user grips the grips of the first arms and pulls the grips away from the container body, whereby the locking pawl at the base end of each first arm is detached from the container body side and the lid unit is disengaged. Thus detached, the locking pawl at the base end is in a position where it does not come into contact with the container body and, consequently, the lid unit can be easily detached. At their limit positions, the first arm is at 90° with respect to the second arm and the second arm is at 35° with respect to the container body.

In another aspect of the invention, there is provided a thin plate supporting container comprising a container body for housing therein a plurality of thin plates, a lid unit for closing the container body, and slotted plates provided on side walls facing each other in the container body for supporting the housed thin plates from opposing sides, wherein a thin plate pressing member is provided on the interior face of the lid unit for supporting the thin plates by pressing against their upper peripheries when the lid unit is attached to the container body. Fitting grooves in which the thin plates are individually fitted and supported are provided in the thin plate pressing member, the fitting grooves being formed at an acute angle so as to catch the peripheries of the thin plates. Consequently, even when a strong impact is received by the thin plate supporting container, because the periphery of the thin plate is lodged within the fitting groove formed at an acute angle, rotation of the thin plate is prevented, and the thin plate can be reliably supported.

According to yet another aspect of the invention, there is provided a thin plate supporting container comprising a container body for housing therein a plurality of thin plates, a lid unit for closing the container body, and slotted plates provided on side walls facing each other in the container body and supporting the housed thin plates from opposing sides, wherein a thin plate pressing member is provided on the interior face of the lid unit for supporting the thin plates by pressing against upper portion of thin plates housed in the container body when the lid unit is attached to the container body. The thin plate pressing member has a number of pressing bands which are arranged in parallel for independently contacting the periphery of a thin plate, thereby individually supporting the thin plates at predetermined intervals. The pressing bands are formed in a wavy shape along the peripheries of the thin plates. Since the pressing bands are formed along the peripheries of the thin plates, even when a thin plate is displaced, it does not enter a gap between the pressing bands.

According to another aspect of the invention, there is provided a thin plate supporting container comprising a container body for housing therein a plurality of thin plates, a lid unit for closing the container body, and slotted plates provided on side walls facing each other in the container body for supporting the housed thin plates from opposing sides, wherein body positioning means for positioning the container body is provided on the bottom of the container body (when disposed transversely), the body positioning means including V-shaped groove plates provided in three positions and extending in three directions on the bottom of the container body, and supporting stands for supporting the V-shaped groove plates. Since the V-shaped groove plate is attached as a separate member to the supporting stand of the body positioning means, the V-shaped groove plate can be fabricated of a material suitable for mating with the projection on a container handling device. The V-shaped groove plate is made of a material having low surface frictional resistance. Thus, when the projection on the other side is fit in the V-shaped groove plate made of a material having low surface frictional resistance, the projection smoothly slides on the V-shaped groove plate into the accurate position and accurate positioning can be achieved.

The V-shaped groove plate is detachably mounted on the supporting stand so that the V-shaped groove plate can be easily replaced in accordance with the material of the projection.

DETAILED DESCRIPTION OF THE PREFERRED EMBODIMENTS

Embodiments of the invention will be described hereinbelow with reference to the appended drawings. The thin plate supporting container of the present invention is suitable for housing, storing, transporting, and producing thin plates such as semiconductor wafers, storage disks, and liquid crystal glass substrates. In the description which follows, a container for housing semiconductor wafers will be described by way of example.

Figure 1:
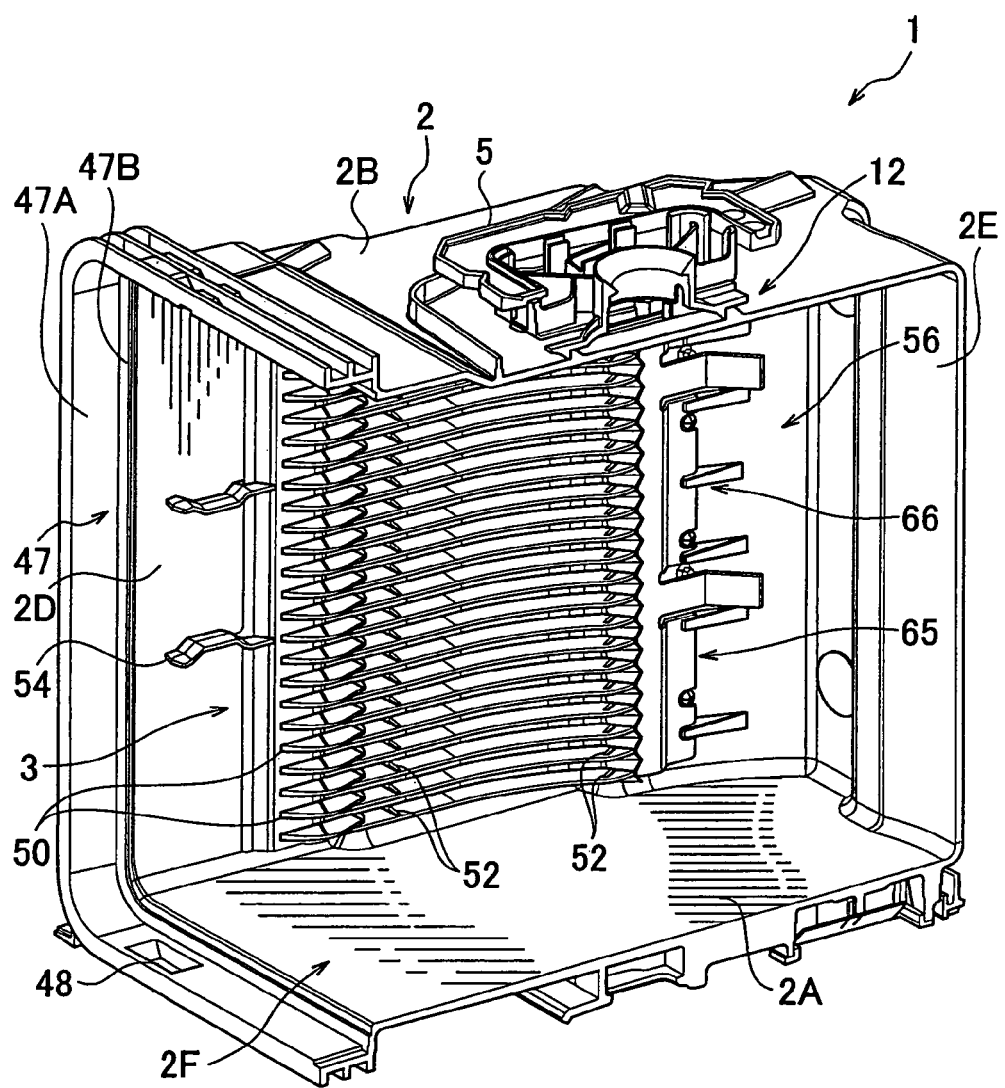
FIG. 1 is a sectional perspective view of a thin plate supporting container of an embodiment of the present invention.
Figure 2:
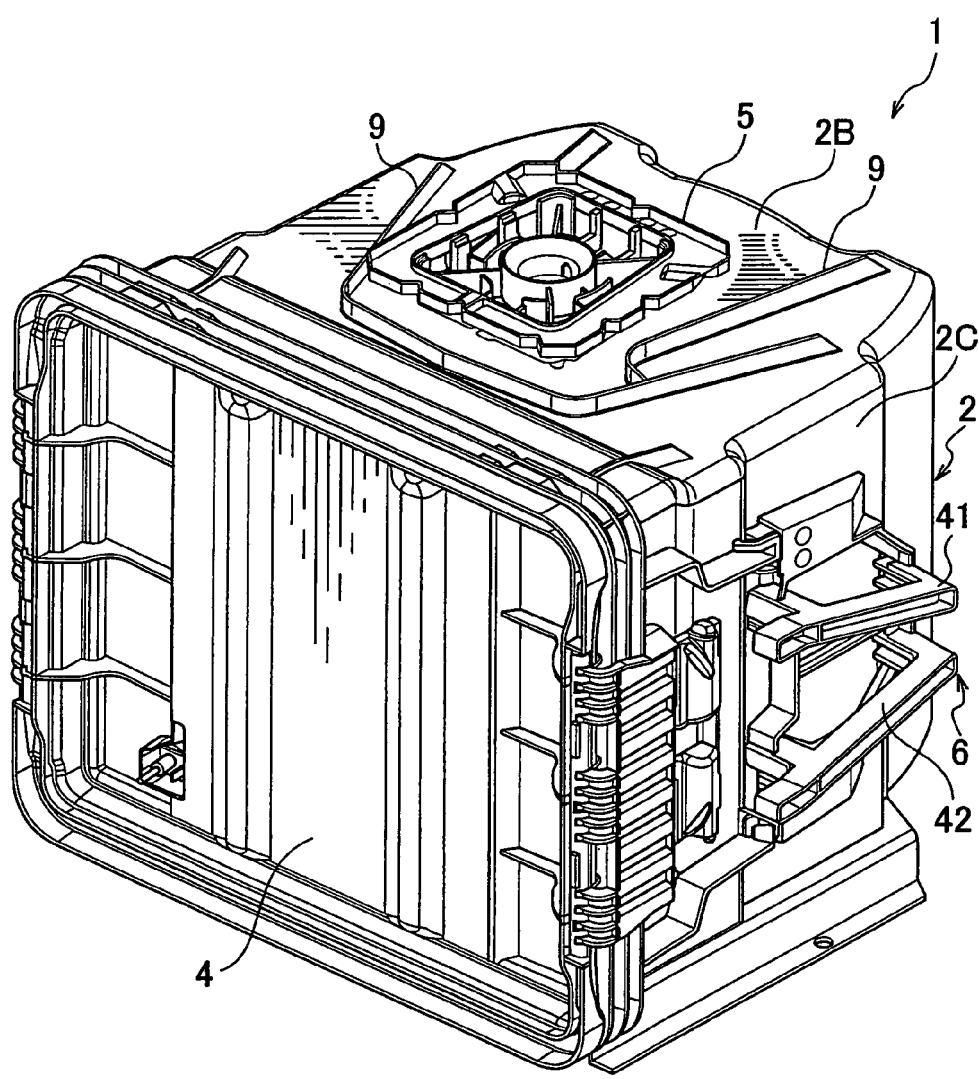
FIG. 2 is a perspective view of the thin plate supporting container of the embodiment of FIG. 1.
Figure 3:
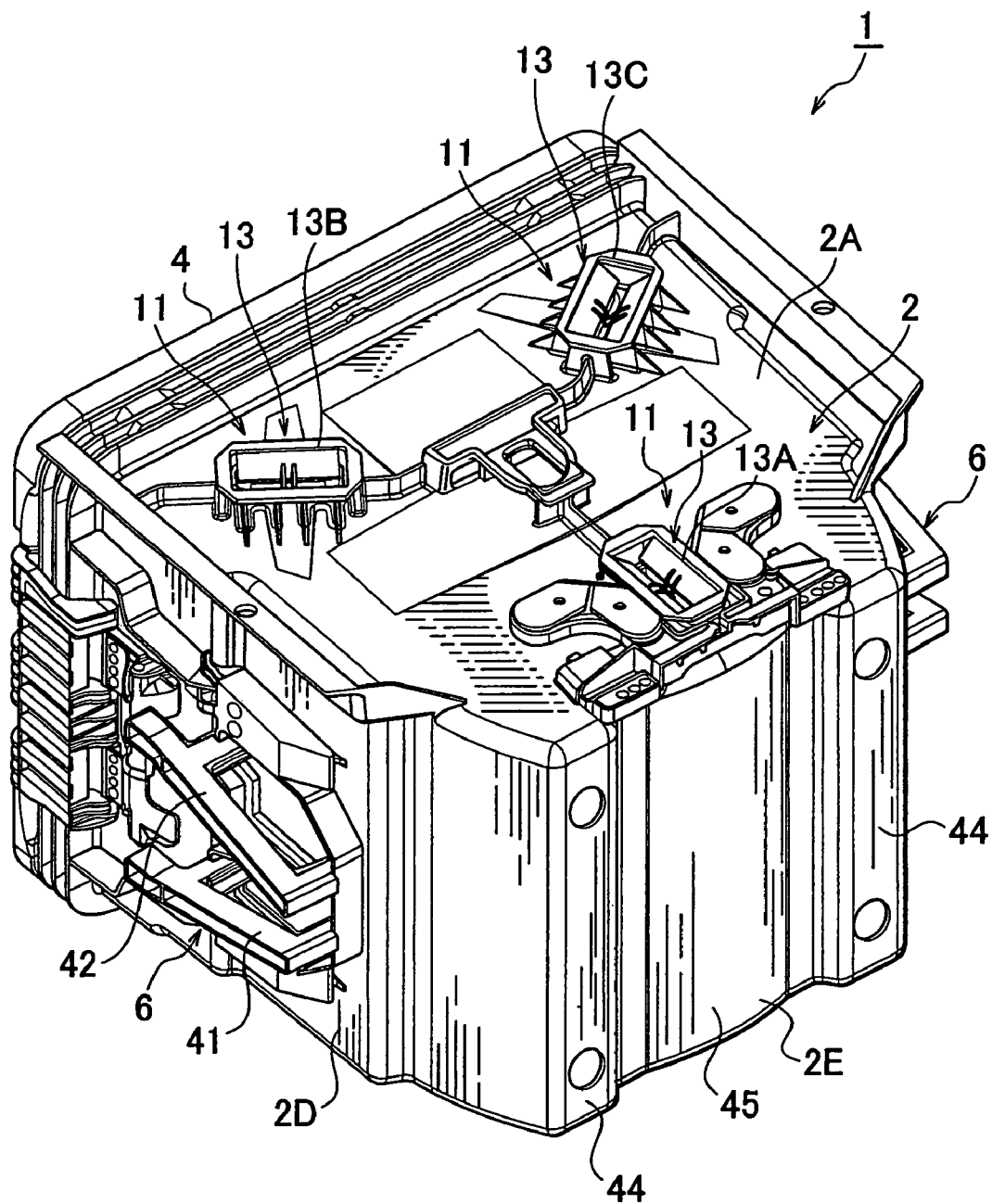
FIG. 3 is a perspective view showing the bottom of the thin plate supporting container of the embodiment of FIGS. 1 and 2.

A thin plate supporting container 1, as shown in FIGS. 1 to 3, includes a container body 2 for housing therein a plurality of semiconductor wafers S (refer to FIG. 16), two slotted plates 3 provided on opposite side walls in the container body 2 and supporting the housed semiconductor wafers S from both sides, a lid unit 4 for closing an opening 2F of the container body 2, a top flange 5 for engagement with an arm of a transporting apparatus (not shown), and a handle 6 gripped by the user for carrying the thin plate supporting container 1.

The container body 2 is formed in an almost cubic shape. The container body 2 comprises four side walls 2A, 2B, 2C, and 2D serving as peripheral walls and a bottom plate 2E, and an opening 2F is provided at the top of the container body 2. Ribs 9 for reinforcement are provided on each of the side walls 2A, 2B, 2C, and 2D. When the container body 2 is positioned to face a robot (not shown) for carrying wafers in a manufacturing line, it is positioned with accuracy and set transversely on a stand (as shown in FIG. 2). On the outside of the side wall 2A (which serves as the bottom) is provided, body positioning means 11. The top flange 5 is detachably mounted by an attaching/detaching mechanism 12 to the outside of the side wall 2B serving as the top. On the exterior of the side walls 2C and 2D are detachably mounted the handles 6 for carrying.

The body positioning means 11 is in the form of, as shown in FIG. 3, three V-shaped fitting grooves 13. The fitting grooves 13 include a vertically oriented first fitting groove 13A and second and third fitting grooves 13B and 13C inclined at an angle (almost 60 degrees) to the vertical. The three grooves 13 are set to have high dimensional precision in accordance with a standard. When the fitting grooves 13A, 13B, and 13C of the body positioning means 11 are mated with fitting projections (not shown) of a stand used in a semiconductor fabricating process, the thin plate supporting container 1 is accurately positioned, and the semiconductor wafers S may be removed or inserted by a wafer carrying robot.

Each of the fitting grooves 13 includes a V-shaped groove plate 15 and a supporting stand 16. The V-shaped groove plate 15 includes a frame 17, inclined plates 18, and locking pawls 19.

Figure 6:
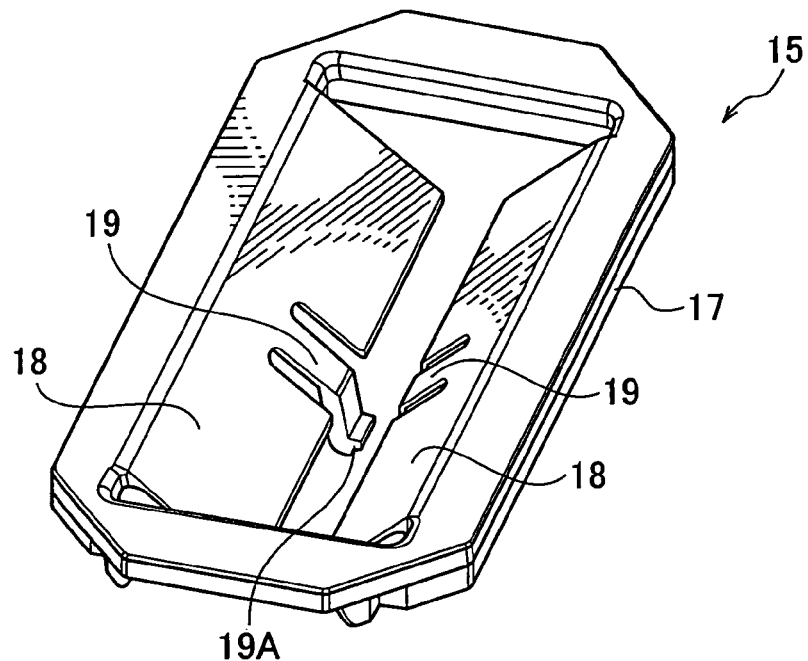
FIG. 6 is a perspective view showing the top of the V-shaped groove plate of the body positioning means.
Figure 7:
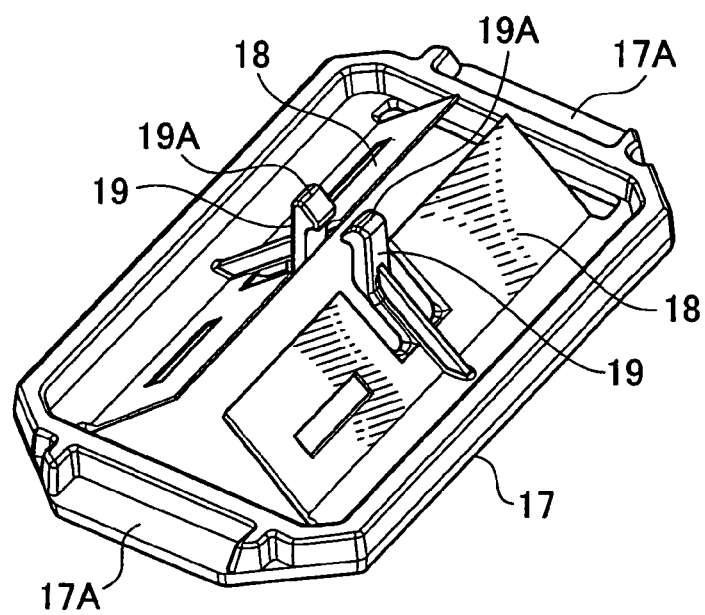
FIG. 7 is a perspective view showing the bottom of, the V-shaped groove plate piece of the body positioning means.
Figure 8:
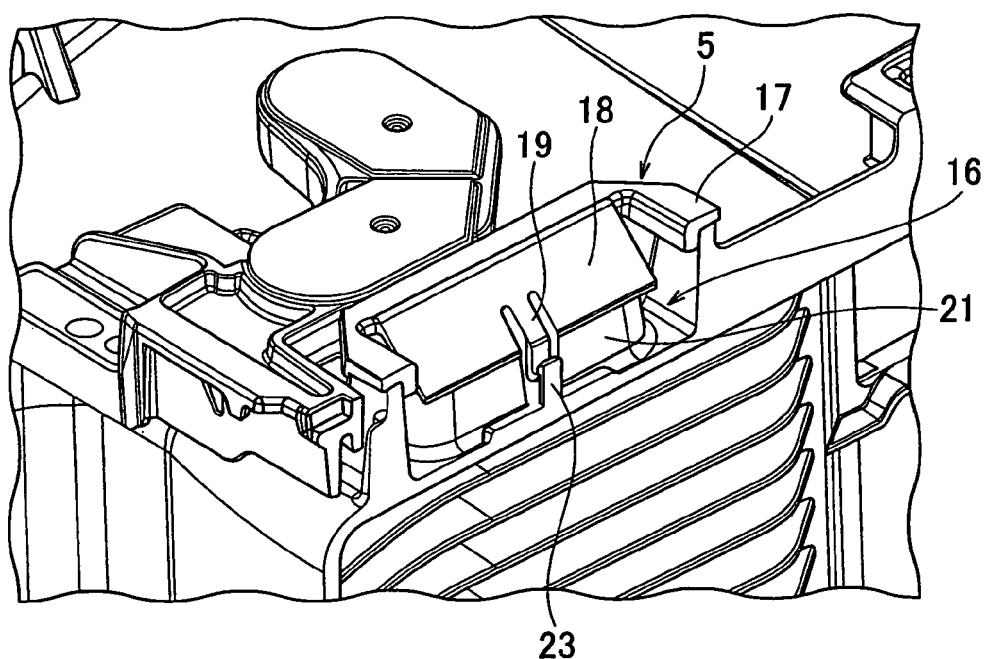
FIG. 8 is a sectional perspective view showing the attachment of the V-shaped groove plate to the supporting stand of the body positioning means.

The frame 17 supports the inclined plate 18 and the locking pawl 19. The frame 17 is formed in a rectangular shape so as to mate with a notch 21C for engagement with a supporting stand 16. Both end portions of the frame 17 are provided with supporting plate fitting notches 17A which seat on end supporting plates 22 of the supporting stand 16. Two inclined plates 18 are provided for each frame 17 and extend downward to the inside. The thickness of the inclined plate 18 is set in relation to the supporting stand 16 so that the upper surface (the upper surface in FIG. 6) has a predetermined dimension. The V-shaped groove plate piece 15 is made of a material having a low surface frictional resistance, so that a fitting projection of a mounting stand used in the semiconductor fabricating process slides smoothly into the V-shaped groove for accurate positioning of the thin plate supporting container 1. An example of the material is PBT.

The locking pawls 19 (FIG. 6) are members for fixing the V-shaped groove plate 15 to the supporting stand 16. The locking pawls 19 extend from the center portion of the inclined plate 18 downward to the inside. The tip of the locking pawl 19 extends inward, perpendicular to its length, to form a catch portion 19A which engages a locking projection 23 of the supporting stand 16. In such a manner, the V-shaped groove plate 15 is detachably fitted on the supporting stand 16. The V-shaped groove plate 15 is formed of a material having low surface frictional resistance matched with the material of the fitting projection of the mounting stage used in the semiconductor fabricating process so that the fitting projection can easily slide into the V-shaped groove plate 15 to provide accurate positioning.

The supporting stand 16, which serves to support the V-shaped groove plate 15, includes inclined support plates 21, end-portion supporting plates 22, and a locking projection 23.

The inclined support plates 21 accurately position and support the inclined plates 18 of the V-shaped groove plate piece 15. Four plate pieces, each having a U shape in plan view, have inclined faces which come into direct contact with and support the inclined plates 18 of the V-shaped groove plate 15. The dimensions of the inclined face 21A are accurately set so that the upper surface of the inclined plate 18 of the V-shaped groove plate piece 15 supported by the inclined faces 21A, is in a predetermined position. Since the tip portion of the fitting projection of the mounting stand comes into contact with the inclined plate 18, an inner portion 21B of the inclined face 21A having a U shape in plan view is finished to have more accurate dimensions. At an upper end portion of each inclined supporting plate 21 is a fitting notch 21C. The fitting notch 21C fits the frame 17 of the V-shaped groove plate 15. The V-shaped groove plate 15 is supported at eight fitting notches 21C.

The upright end-portion supporting plates 22 support the longitudinally opposed ends of the V-shaped groove thin plate 15 which is fitted with notches 21C of the inclined supporting plates 21. The upper end portions of the end-portion supporting plates 22 fit into the notches 17A of the frame 17 of the V-shaped groove plate 15, thereby stably supporting the V-shaped groove plate 15 while preventing displacement in the longitudinal direction.

The locking projection 23 is provided centrally between the inclined supporting plates 21. The upper end portion of the locking projection 23 is enlarged for engagement by the catch portion 19A of the locking pawl 19 of the V-shaped groove plate 15.

Figure 9:
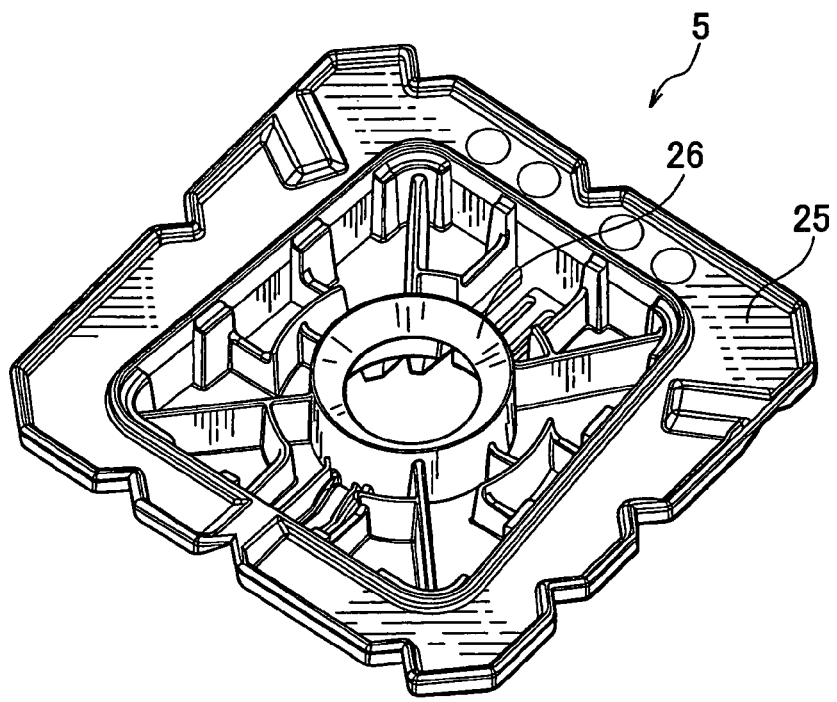
FIG. 9 is a perspective view showing a top flange of the embodiment of FIG. 1.
Figure 10:
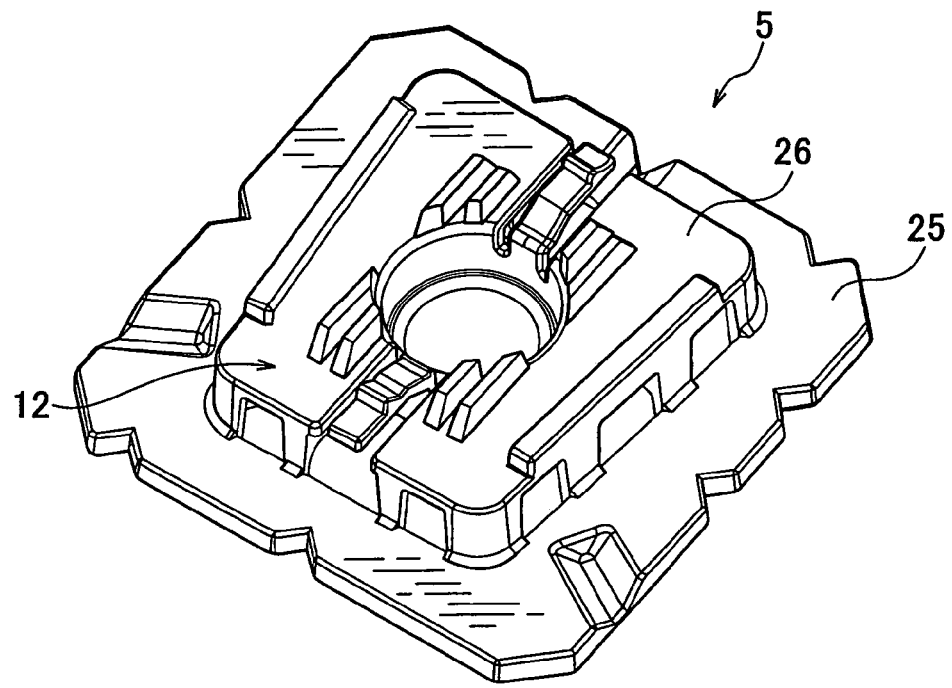
FIG. 10 is a perspective view showing the bottom of the top flange of the embodiment of FIG. 1.

The top flange 5, as shown in FIGS. 9 and 10, has a flange portion 25 and a body portion 26. The flange portion 25 is designed to be gripped by an arm (not shown) of the transporting apparatus for transport of the thin plate supporting container 1. The body portion 26 supports the flange portion 25 and serves to attach it to the container body 2. The back face of the body portion 26 is engaged by one of the members of the attaching/detaching mechanism 12 which will be described below.

In the center of the side wall 2B of the container body 2 is located the other member of the attaching/detaching mechanism 12 for detachably securing the top flange 5. The attaching/detaching mechanism 12 is constructed as shown by FIG. 1 and FIGS. 11 to 15. More specifically, the attaching/detaching mechanism 12 includes a sliding and supporting means 27, locking means 28, and guide rails 29.

Figure 11:
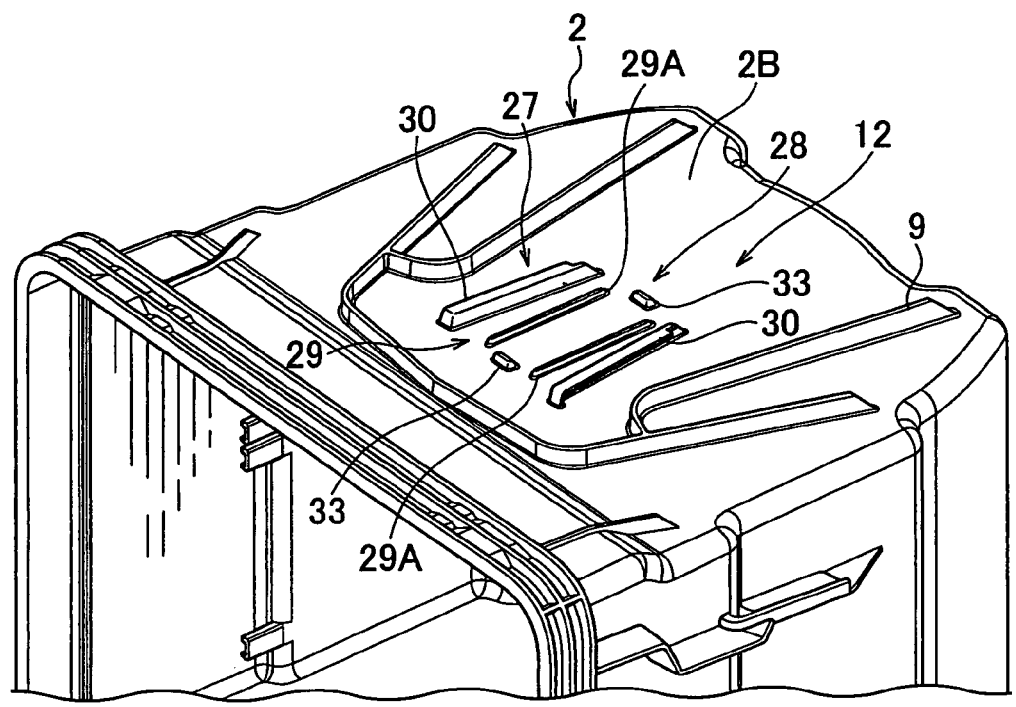
FIG. 11 is a partial perspective view showing the container body of the embodiment of FIG. 1.
Figure 12:
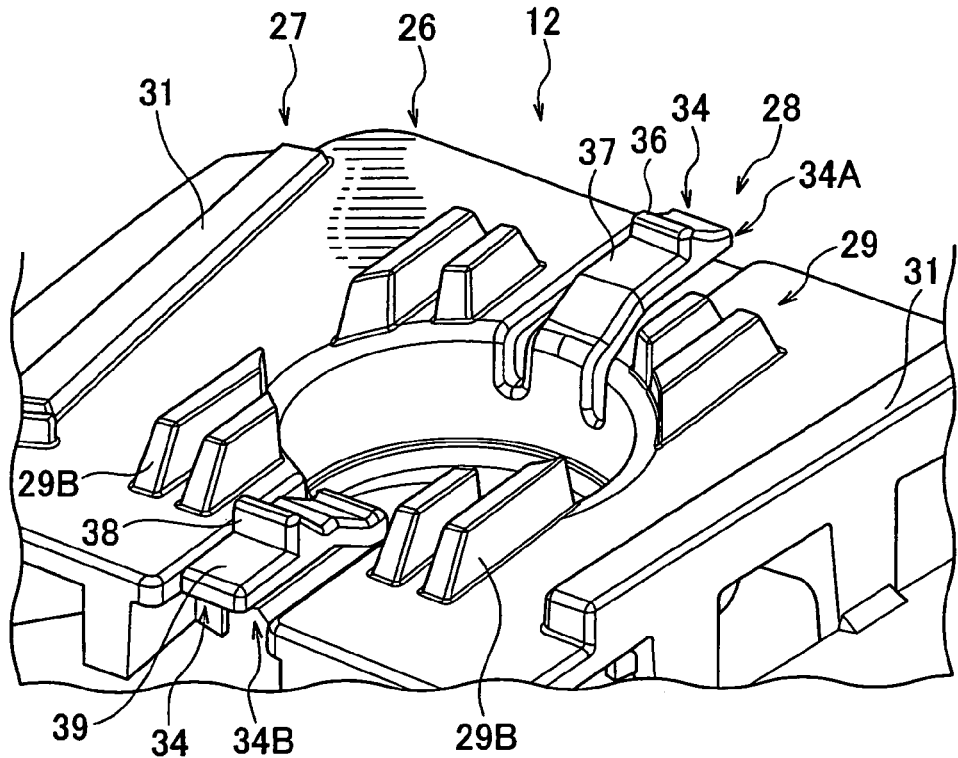
FIG. 12 is a perspective view showing the top flange side of an attaching/detaching mechanism of the embodiment of FIG. 1.
Figure 13:
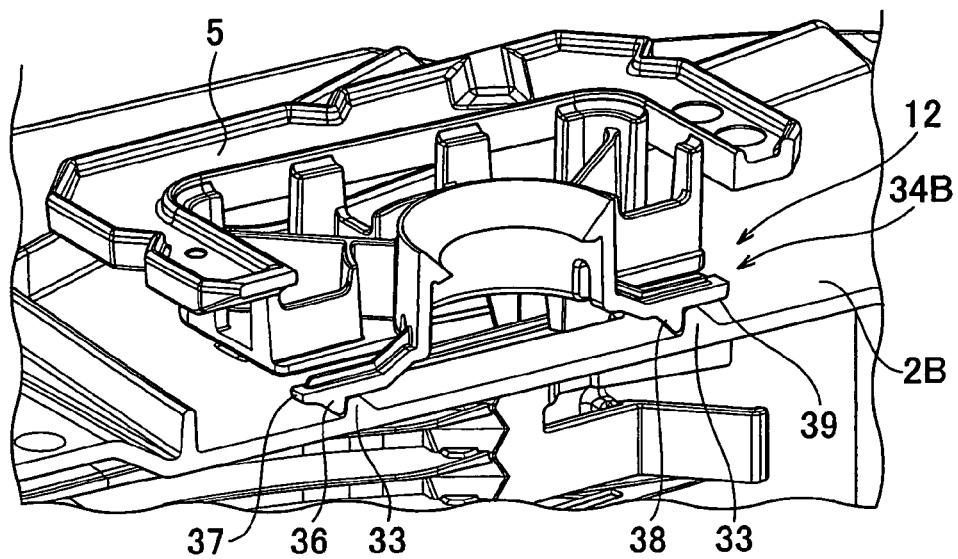
FIG. 13 is a sectional perspective view showing attachment of the top flange to the container body.
Figure 14:
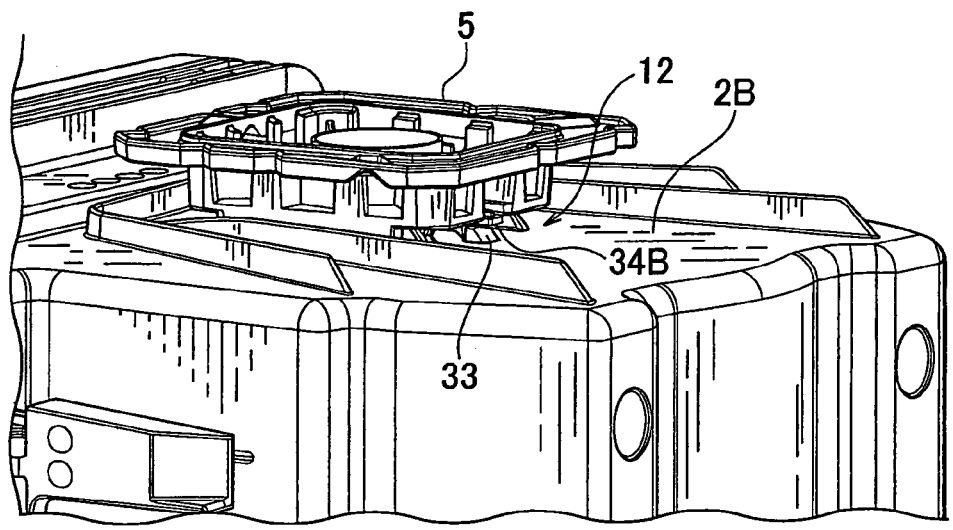
FIG. 14 is another perspective view of attachment of the top flange to the container body.
Figure 15:
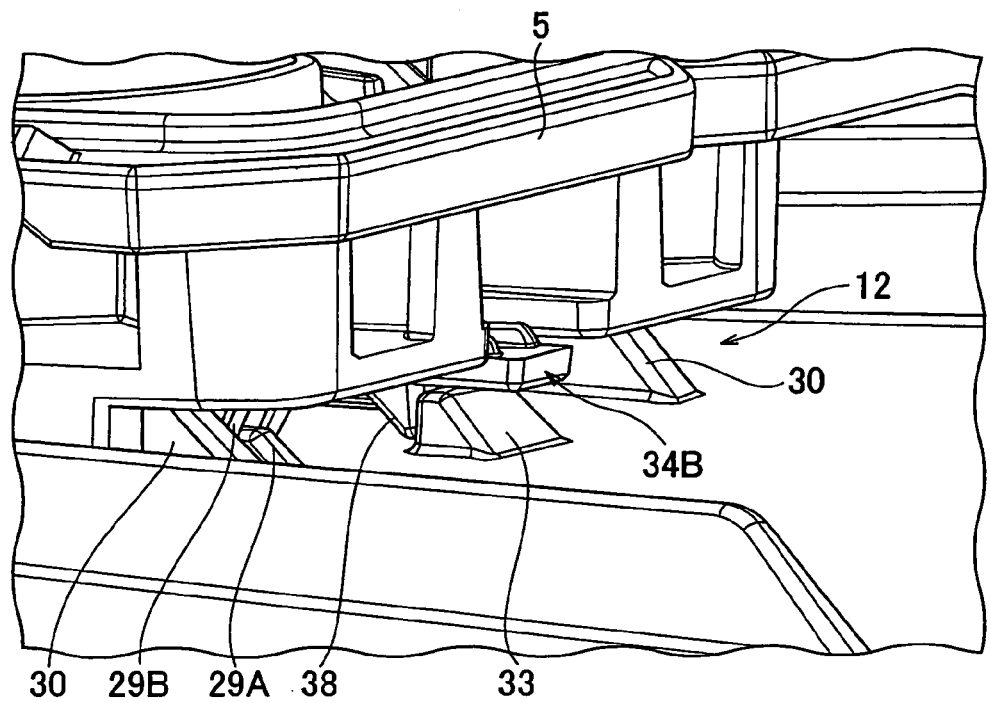
FIG. 15 is yet another perspective view showing attachment of the top flange to the container body.

The sliding and supporting means 27 includes a supporting portion 30 provided on the container body 2 and a sliding portion 31 which is provided on the top flange 5 and which is inserted into the supporting portion 30 from the front side (from the right side toward the left side in FIG. 11). The supporting portion 30 is formed by two rail members arranged in parallel on the outer surface of the side wall 2B of the container body 2. The rail members have grooves which open outward, i.e. are provided on the outer sides of the two rail members and open opposite each other. The sliding portion 31 is made of spaced rail members located at positions corresponding to the supporting portions 30 and having grooves which open to the inside (facing). The supporting portion 30 and the sliding portion 31 are set so that the interval between the rail members on the front side (the right side in FIG. 11) is narrower than that at the rear side so that the sliding portion 31 can be easily engaged with the supporting portion 30.

The locking means 28 serves to lock the container body 2 and the top flange 5 together so as not to move relative to each other, when slidably supported by the sliding and supporting means 27. The locking means 28 is formed by locking projections 33 provided on the container body 2 and locking pawls 34 provided on the top flange 5. Two locking projections 33 are provided on the side wall 2B. Each of the locking projections 33 is centrally located between the ends of the two rail members of the supporting portion 30. The surface of the locking projection 33 facing the inner side (the left side in FIG. 11) serves as a perpendicular contact surface, and the locking projection 33 prevents the locking pawl 34 from movement toward the front side (the right side in FIG. 11).

The inner-side and front-side locking pawls 34A and 34B engage the locking projections 33 to prevent the top flange 5 from coming off and extend from the body portion 26 of the top flange 5. The inner-side locking pawl 34A includes a catch 36 which engages the locking projection 33 on the top wall 2B, and a supporting bar 37 for supporting the catch 36. The catch 36 comes into engagement with the locking projection 33 at a perpendicular contact face to thereby prevent the top flange 5 from movement to the front. The front-side locking pawl 34B includes a catch 38 which engages the locking projection 33 on the front side and a supporting bar 39 for supporting the catch 38. The catch 38 comes into contact with locking projection 33 at a perpendicular surface facing the front side face to thereby support the locking pawl 34B so as to prevent movement to the front side. The catch 38 is closer to the body portion 26 than to the distal end of the supporting bar 39. Accordingly, in the case where a force is received which tends to dislodge the top flange 5, the catch 38 is pressed strongly against the locking projection 33. Thus, even if a strong force is applied by an impact or the like, the catch 38 is reliably prevented from releasing from the locking projection 33. Accordingly, the supporting bar 39 resists detachment of the top flange 5.

The guide rails 29 serve to position the top flange 5 in a direction orthogonal to the direction of guided sliding of the top flange 5. The guide rails 29 include a fitting rail 29A and a receiving rail 29B. Two fitting rails 29A, each a single rail member, are provided on the inner side of the two rails members 30, on the side wall 2B of the container body 2. The receiving rails 29B each consists of two rail members sandwiching a fitting rail 29A therebetween and depend from the top flange 5 opposite the fitting rail 29A. The fitting rails 29A and the receiving rails 29B are provided in parallel with each other. Accordingly, the fitting rails 29A, each fitted between receiving rails 29B provide a slidable mount for the top flange 5, thereby enabling the top flange 5 to be easily attached/detached to/from the container body 2.

As shown in FIGS. 2 and 3, each handle 6 comprises two gripping bars 41 and 42. The gripping bars 41 and 42 are set at angles different from each other. Accordingly, the user selectively grips one of the two gripping bars 41 and 42 according to the orientation (portrait or landscape orientation) of the thin plate supporting container 1. The angle of one of the gripping bars 41 and 42 is set to optimize carrying the thin plate supporting container 1 longitudinally and the other angle is set to optimize carrying the thin plate supporting container 1 transversely. Specific angles are properly set according to various factors such as the size, weight, and the like of the thin plate supporting container 1. The handles 6 are detachably mounted on the side walls 2C and 2D by an attaching/detaching mechanism having the same structure as that of the attaching/detaching mechanism 12.

Figure 16:
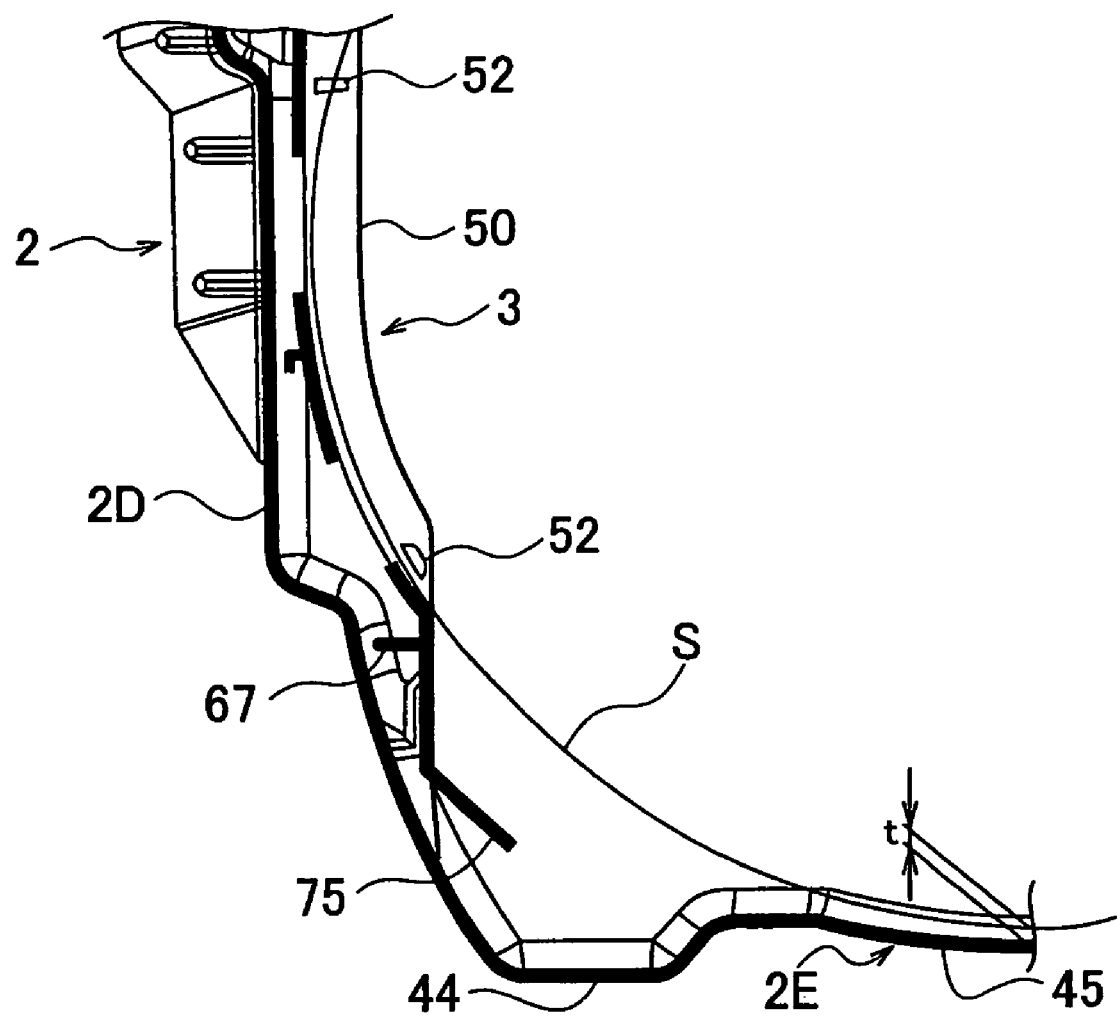
FIG. 16 is a cross-sectional view showing attachment of a slotted plate to the container body.

The bottom plate 2E has legs 44 and a cover plate 45 as shown in FIGS. 3 and 16. The legs 44 are designed to support the container body 2. The legs 44 are constructed as bar projections on two opposite sides of the bottom plate 2E. The cover plate 45 is a member for covering the lower sides of the semiconductor wafers S housed in the container body 2. The cover plate 45 curves downward between the legs 44. The cover plate 45 is set so that the gap "t" between the lower ends of the semiconductor wafer S housed in the container body 2 and the cover plate 45 is within a certain range, namely, the gap is set to a minimum capable of fully absorbing a shock, for example 3 mm, for the following reason. Since the precision of installation and supporting rigidity of the slotted plates 3 have been improved, even in case of a strong impact due to a fall or the like of the thin plate supporting container 1, the semiconductor wafers S are supported with sufficient strength to minimize downward displacement. In addition, the height of the container body 2 is decreased and the size is reduced by an amount corresponding to the reduction in the gap between the bottom plate 2E and the lower ends of the semiconductor wafers S. Consequently, when the thin plate supporting container 1 is packed, the gap between the bottom of the thin plate supporting container 1 and a packing box is increased as compared with the conventional case, so that cushioning can be increased and the capability of absorbing a shock due a fall or the like can be largely improved.

In an upper end portion of the container body 2, as shown in FIG. 1, a lid unit receiving step (shoulder) 47, with which the lid unit 4 fits, is provided. The lid unit receiving step 47 is formed by enlarging the upper end portion of the container body 2 to the dimensions of the lid unit 4. The lid unit 4 is attached to the lid unit receiving step 47 by fitting with the inner side of a perpendicular plate portion 47A of the lid unit receiving step 47 and coming into contact with a horizontal plate portion 47B. Further, a gasket 80 (refer to FIG. 29) attached to the under face of the lid unit 4 comes into contact with the horizontal plate portion 47B, thereby keeping air tightness in the thin plate supporting container 1. On the inside of the perpendicular plate portion 47A of the lid unit receiving step 47, a fitting hole 48 is provided for fixing a special lid unit (not shown), used in the semiconductor fabricating process, to the container body 2. The fitting holes 48 are provided at four corners of the lid unit receiving step 47. The position and shape of the fitting hole 48 are designed to properly mate with the special lid unit used in the semiconductor fabricating process.

The slotted plate 3 is, as shown in FIG. 1 and FIGS. 16 to 23, a member for supporting the housed semiconductor wafers S from opposing sides. A slotted plate 3 is provided for each of the opposite side walls 2C and 2D of the container body 2. Each slotted plate 3 is detachably fixed to the inside of the container body 2. Each slotted plate 3 includes a number of plate elements 50, disposed in parallel at a predetermined interval and supporting the wafers S individually, and a supporting plate 51 for integrally joining and supporting the plate elements 50.

Each plate element 50 extends from the inner side of the container body 2 to an outlet/inlet port (opening 2F) and has a portion extending from the inner side to an intermediate position which is curved along the periphery of the semiconductor wafer S and a portion extending from the intermediate position to the opening 2F along the side wall of the container body 2. Each plate element 50 has, adjacent its opposing ends thin plate supporting projections 52 for supporting the semiconductor wafers S. The thin plate supporting projection 52 closest to opening 2F extends across the point of intersection of the inner periphery of the plate piece 50 and the periphery of the semiconductor wafer S. By providing the thin plate supporting projection 52 as close to as possible to the opening 2F, the semiconductor wafer S is stably supported.

Figure 23:
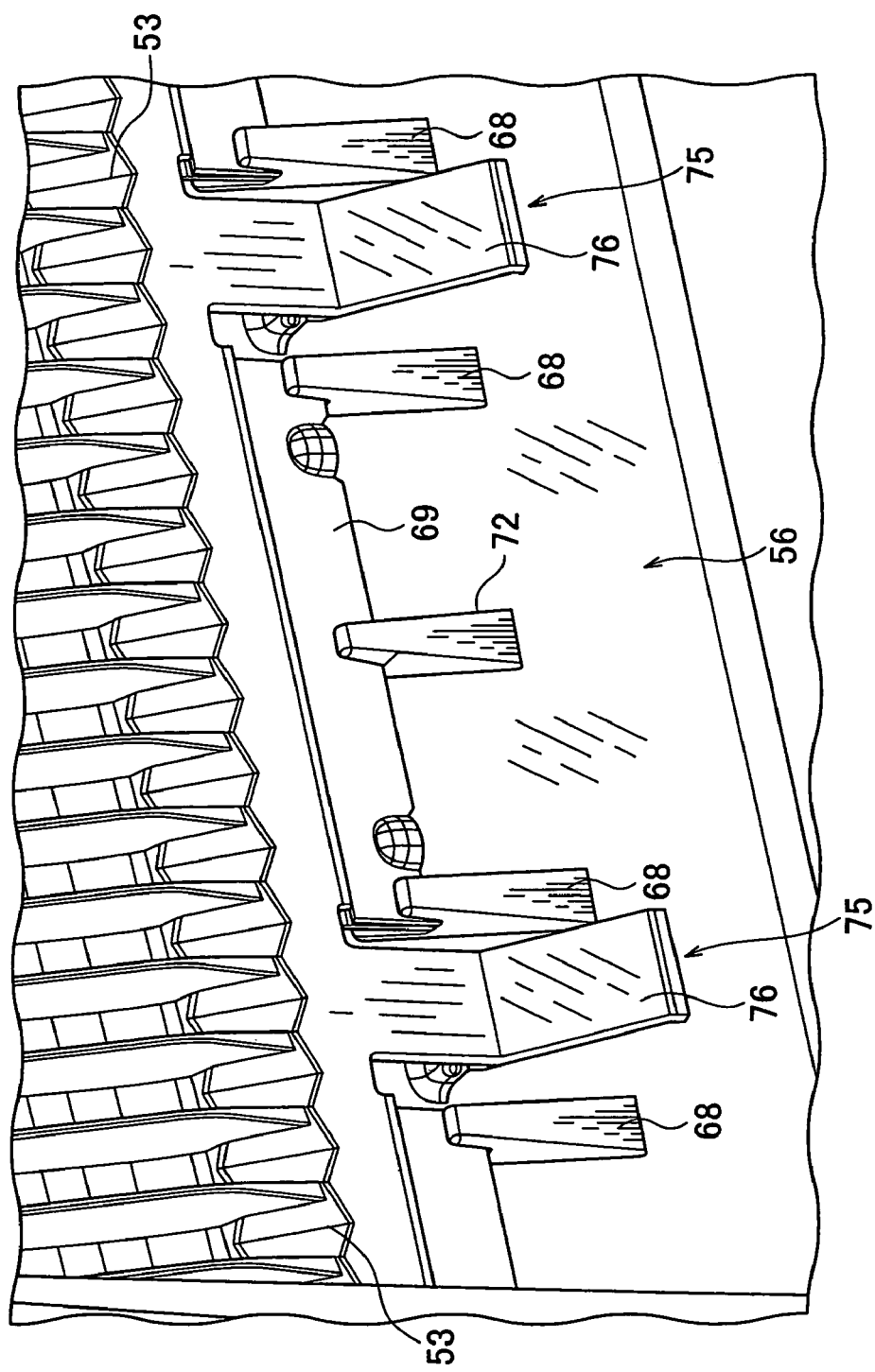
FIG. 23 is an enlarged perspective view showing the lower attachment fitting of the container body.

Between adjacent plate elements 50 on the inner side are V-shaped grooves 53 (see FIG. 23). When the container body 2 is placed longitudinally, the semiconductor wafer S is fit into the V-shaped groove 53 and comes into contact with the bottom portion of the V-shaped groove 53 and is thereby centered.

Two handles 54 are provided on the upper portion of the slotted plate 3 to enable a user to lift the slotted plate 3. The slotted plate 3 is lifted by taking the two handles 54 between the user's fingers.

Supporting plates 51 are provided in three positions, the innermost side (lower left side in FIG. 17), an intermediate position, and inlet side (upper right side in FIG. 17) of each plate element 50, and integrally support the plate elements 50.

A slotted plate 3 is detachably fixed to each of the side walls 2C and 2D which face each other in the container body 2 by upper fitting means 55 and lower fitting means 56.

Figure 17:
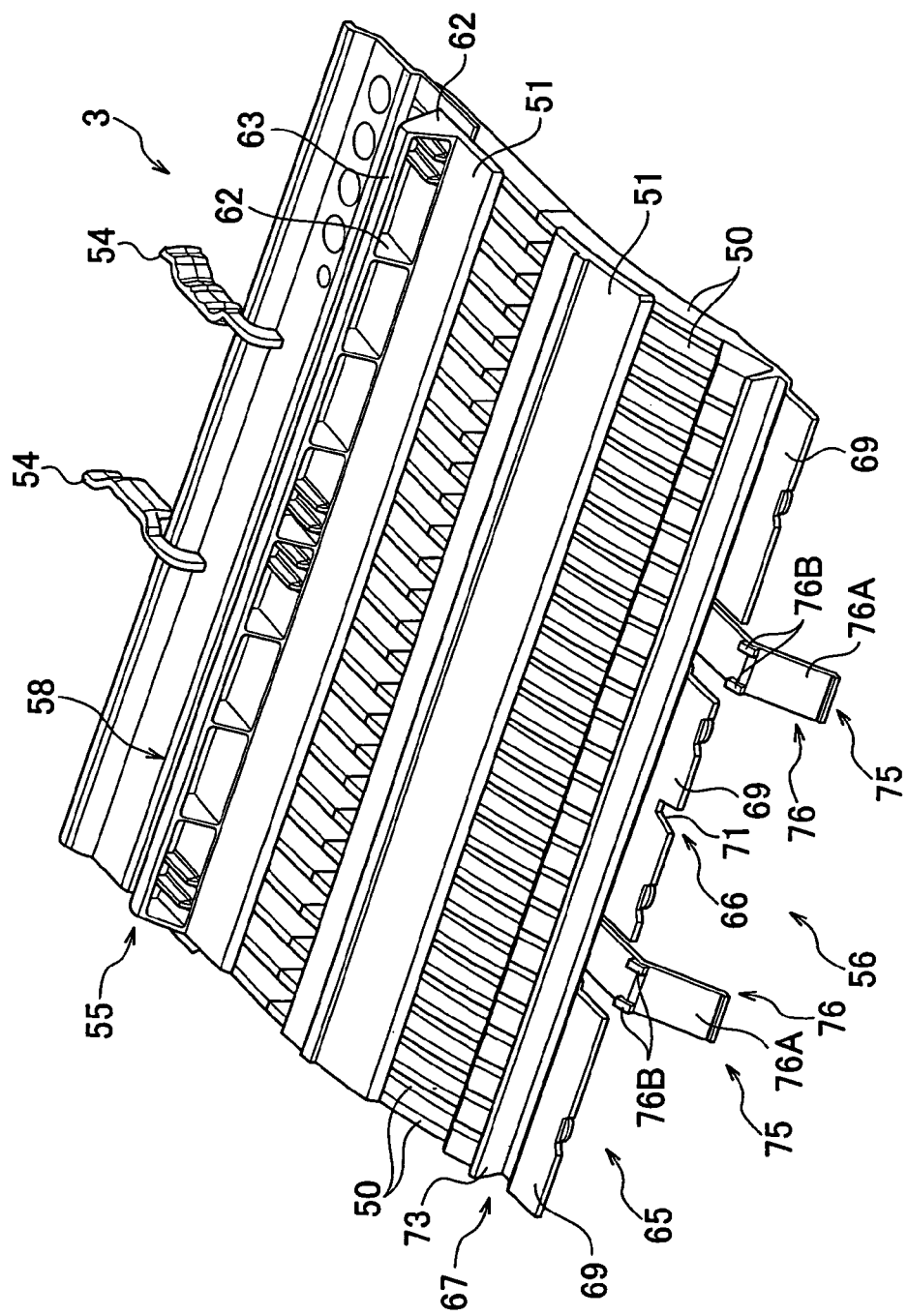
FIG. 17 is a perspective view of the slotted plate.
Figure 18:
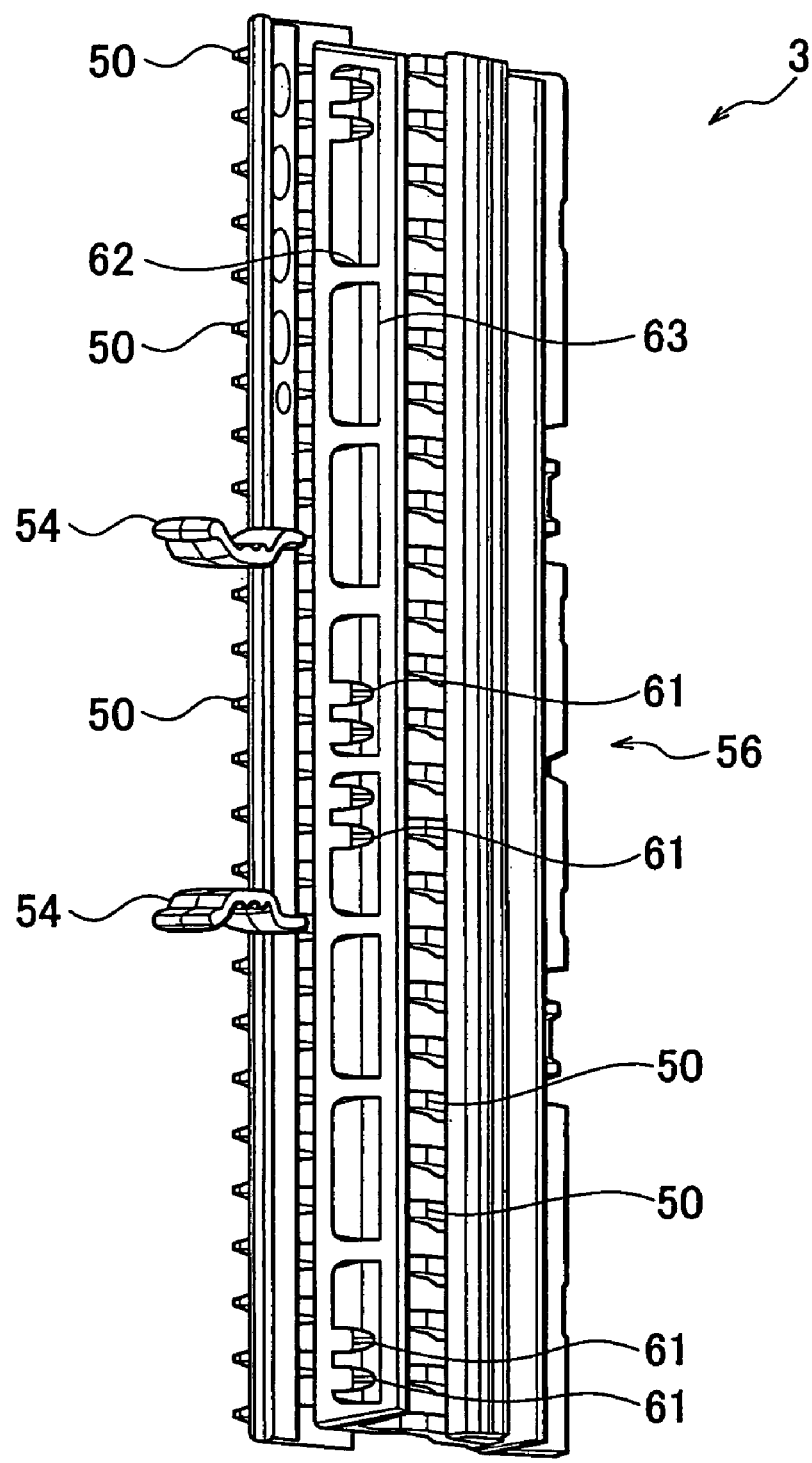
FIG. 18 is a planar view of the slotted plate.
Figure 19:
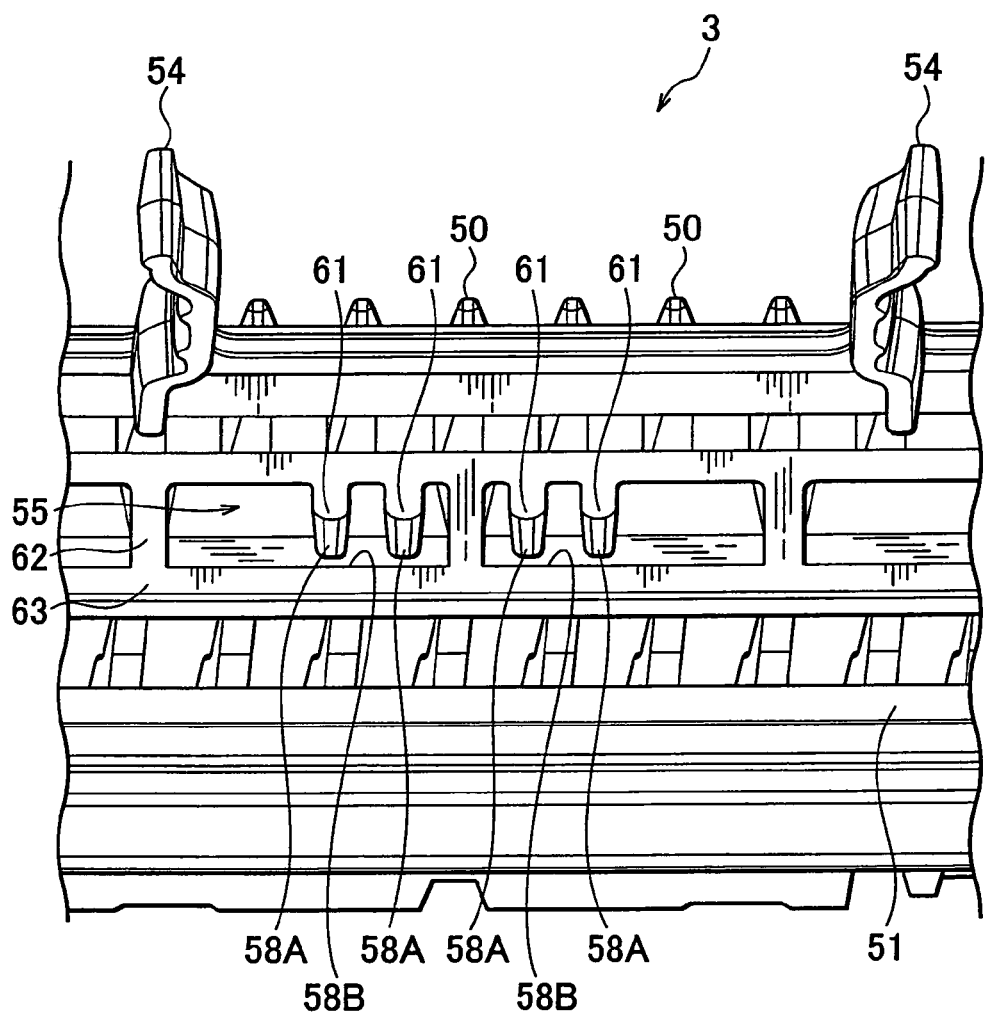
FIG. 19 is an enlarged planar view of the slotted plate.
Figure 20:
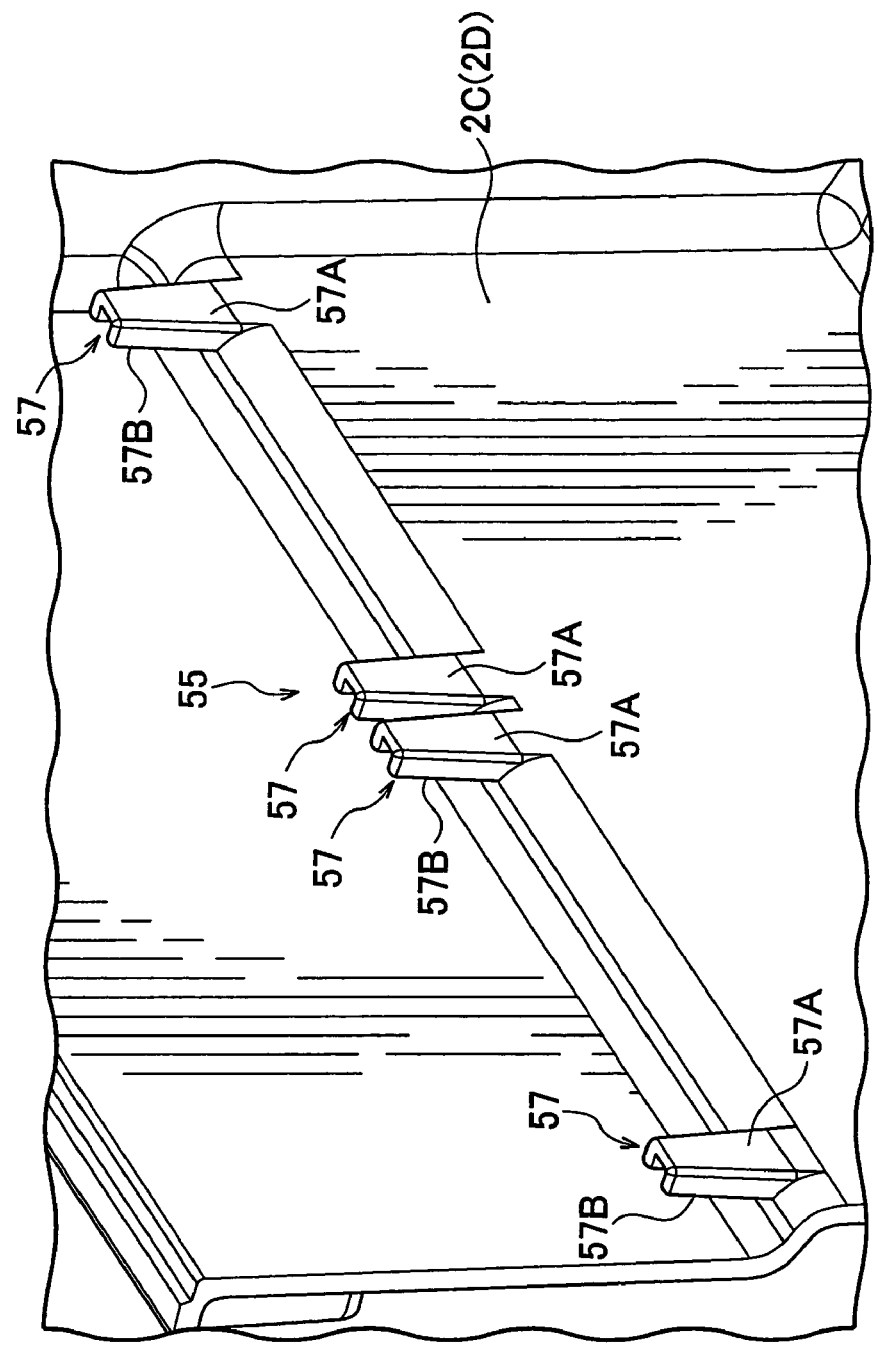
FIG. 20 is a perspective view showing an upper attachment fitting of the container body.

The upper fitting means 55, which attaches the upper portion of the slotted plate 3 to the container body 2, includes upper fitting lugs 57 on the side walls of the container body 2 (FIG. 20) and an upper mounting piece 58 on the slotted plate 3 (FIG. 17). An upper fitting lug 57 is provided for each of the sidewalls 2C and 2D. A step 59 (FIG. 20) is provided at an intermediate position on the side walls 2C and 2D. The four upper fitting lugs 57 are located in the step 59. According to the size of the slotted plate 3, three or five or more upper fitting lugs 57 may be provided. The upper fitting piece 57 is formed in a U shape in plan view (see FIG. 22). The U-shaped upper fitting lug 57 includes a contact plate 57A and supporting legs 57B. The contact plate 57A is flat for contact with the slotted plate 3 to position the slotted plate 3 in the longitudinal direction (the direction from the left inner side to the right front side in FIG. 20), while preventing turning of the slotted plate 3. Since the slotted plate 3 is positioned in the longitudinal direction by using the contact plate 57A as a reference, the contact plate 57A is formed in accurate position and dimensions. The supporting legs 57B support the contact plate 57A in contact with the slotted plate 3.

Figure 22:
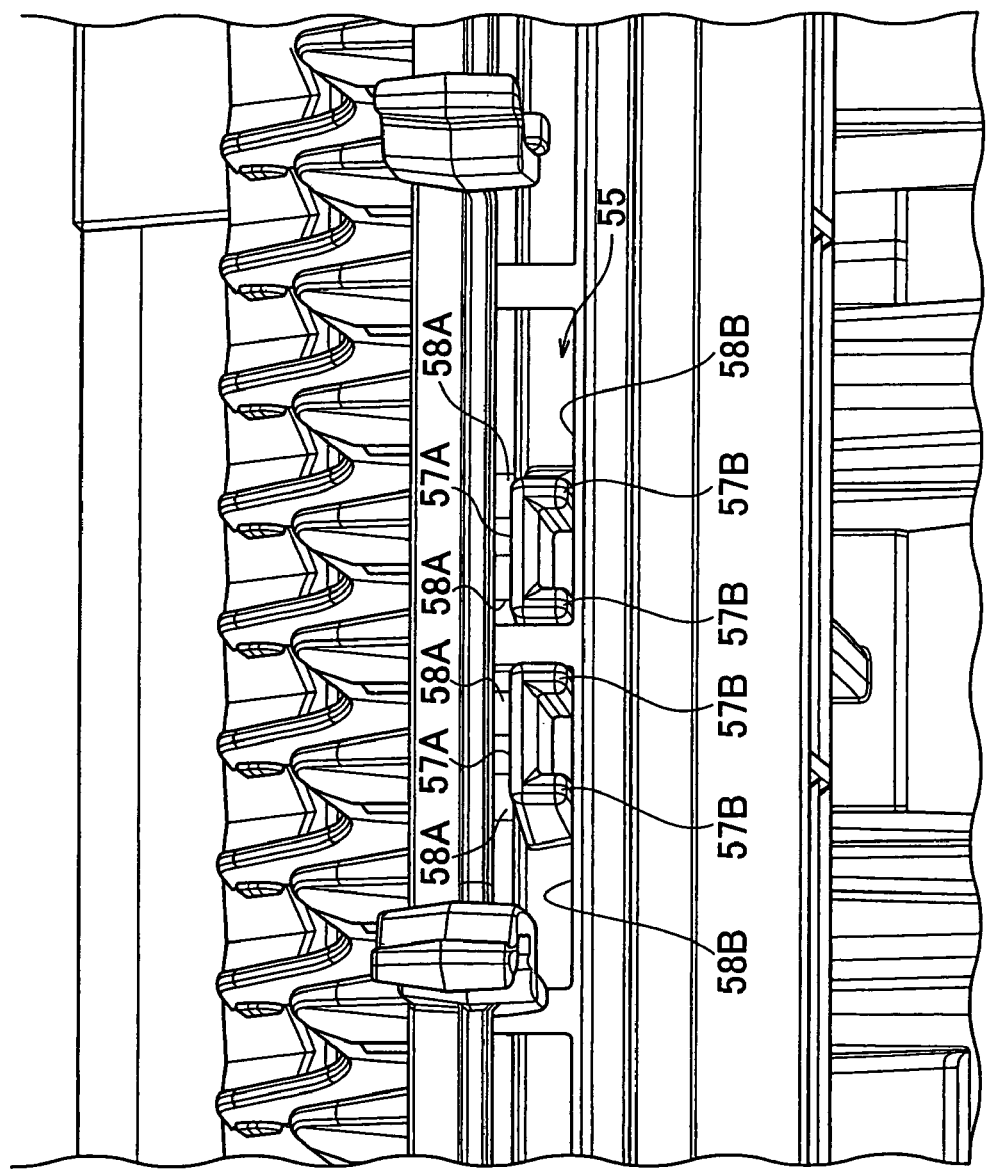
FIG. 22 is an enlarged planar view showing the upper attachment fitting of the container body.

The upper mounting bracket 58 (FIGS. 17, 18, 19 and 22) mates with the upper fitting lugs 57 to longitudinally position the slotted plate 3. The upper mounting bracket 58 is provided at a position on the slotted plate 3 facing the upper fitting lug 57 in the slotted plate 3. As shown in FIG. 22, the upper mounting bracket 58 includes slots 58B and projections 61 each having a contact face 58A for contacting the contact plate 57A of the upper fitting lugs 57 to longitudinally position the slotted plate 3, while preventing turning of the slotted plate 3. In this embodiment, two projections 61 come into contact with the contact plate 57A of one upper fitting lug 57. The shape of the projection bar 61 is designed to prevent shrinkage at the time of molding and improve dimensional precision.

The slot 58B receives the upper fitting lugs 57 in contact with the contact plate 57A of the upper fitting lug 57. The slot 58B is formed in an elongated bracket 63 on the slotted plate 3 and includes a plurality of spaced plates 62. The supporting face 57B can come into contact with the plate member 63 in any position and can support the slotted plate 3.

The contact plate 57A and contact face 58A are in contact with each other so as to prevent turning of the slotted plate 3 and to provide accurate longitudinal positioning of the slotted plate 3. The upper fitting means 55 serves only to longitudinally position the slotted plate 3. Positioning in a direction perpendicular thereto is provided by the lower fitting means 56.

The lower fitting means 56 supports a lower end of the slotted plate 3 and includes vertical positioning means 65 for vertical positioning of the slotted plate 3, a horizontal positioning means 66 for horizontal positioning, and a front/rear positioning means 67 for front/rear positioning. The lower fitting means 56, serves to accurately position the lower portion of the slotted plate 3 in the vertical, horizontal, and front/rear directions.

The vertical positioning means 65 includes a supporting bracket 68 on the container body 2 (FIG. 21) and a lower plate 69 (FIG. 17) on the slotted plate 3.

The supporting bracket 68 is provided on the lower portion of each of the side walls 2C and 2D facing each other in the container body 2, and receives and comes into contact with the lower end of the slotted plate 3, thereby positioning the slotted plate 3 in the vertical direction. More specifically, the supporting plate 68 has a fitting notch 68A which receives the slotted plate 3. The dimension of the fitting notch 68A is accurately set to properly vertically position the slotted plate 3.

The slotted plate has, depending, a lower plate 69 which mates with the fitting notch 68A of the supporting bracket 68. The horizontal positioning means 66 includes a notch 71 formed in the lower plate 69 of slotted plate 3 and a horizontal positioning projection 72 extending from a sidewall 2C (2D) of the container body.

The notch 71 opens downward in the lower plate 69 of the slotted plate 3.

The horizontal positioning projection 72 is located between the vertical supporting plates 68, in the lower portions of each of the side walls 2C and 2D, and is seated in the notch 71 in the lower portion of the slotted plate 3, thereby positioning the slotted plate 3 in the horizontal direction. The horizontal positioning projection 72 is formed in a wedge shape to mate with the notch 71. The front/rear positioning means 67 (FIG. 17) includes a front/rear positioning plate 73. The front/rear supporting plate 73 is an elongated plate member and is provided on a lower portion of the slotted plate 3 and extends horizontally to the back side of the slotted plate 3 where it comes into contact with a lower portion of a side wall 2C or 2D of the container body 2, thereby positioning the slotted plate 3 in the front/rear direction.

Figure 21:
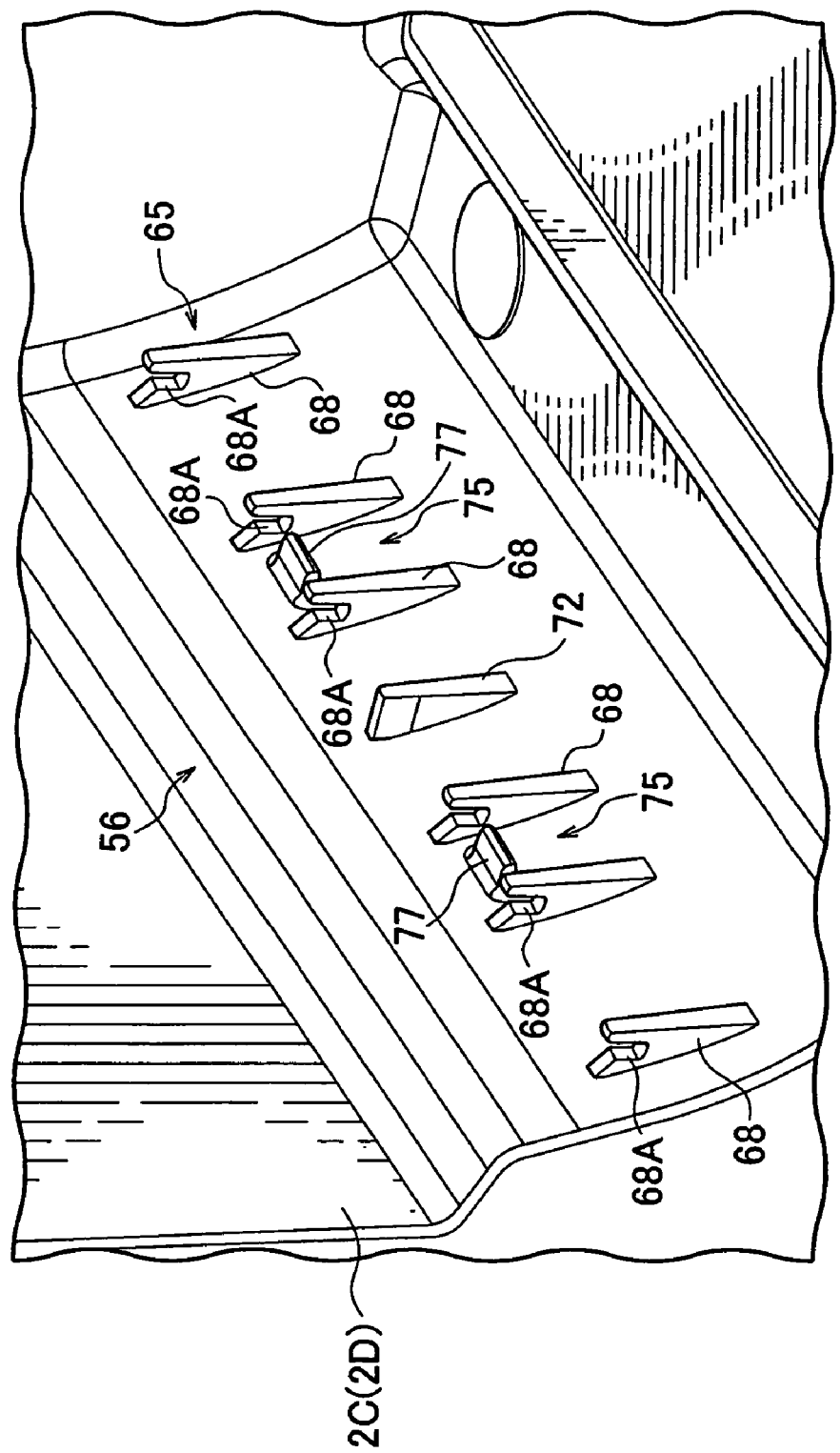
FIG. 21 is a perspective view showing a lower attachment fitting of the container body.

Stopper means 75 serves to prevent disengagement by upward movement of the slotted plate 3. The stopper means 75 a locking member 76 which depends from the lower edge of the slotted plate 3 (FIG. 17) and a locking projection 77 which extends from a side wall of the container body 2 (FIG. 21). The locking member 76 is formed of an elastic plate 76A which extends from the lower edge of the slotted plate 3 and locking pawls 76B provided on the elastic plate 76A. The locking projection 77 is engaged by the locking pawls 76B thereby preventing the slotted plate 3 from coming off by upward movement thereof.

Figure 29:
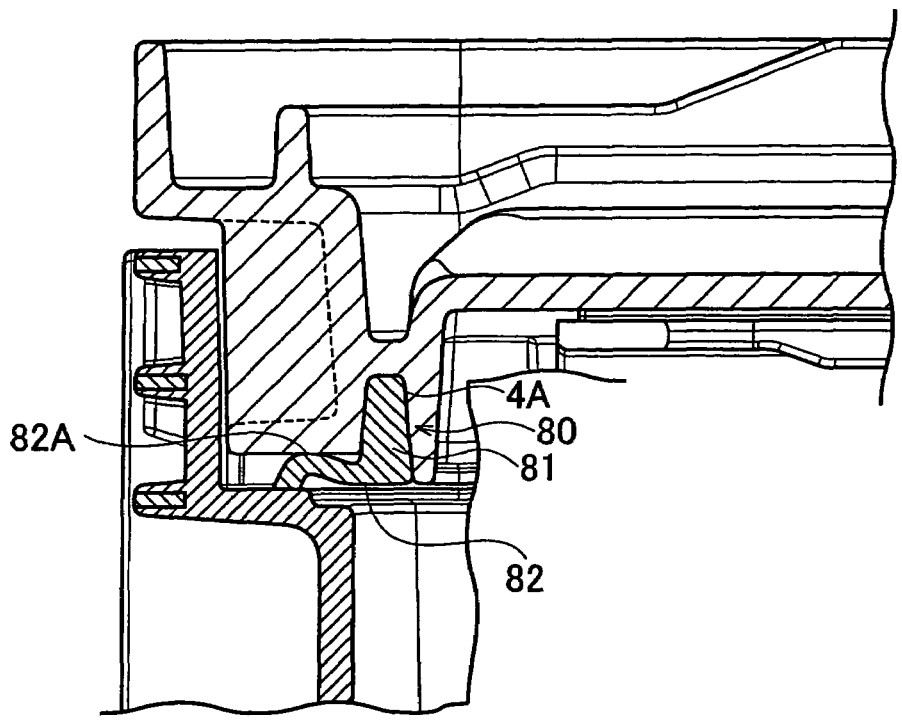
FIG. 29 is a partial cross-sectional view showing a gasket.
Figure 30:
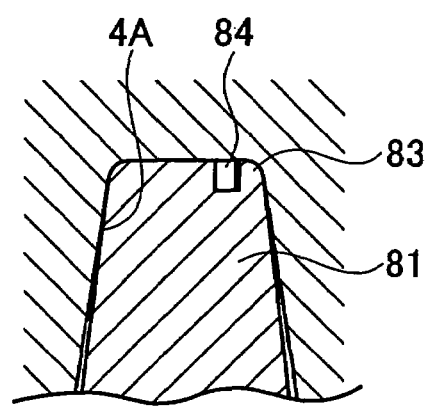
FIG. 30 is a partial cross-sectional view showing a base end supporting portion of the gasket.

As shown in FIG. 2 and FIGS. 29 to 30, the lid unit 4 is formed in a saucer shape which opens upward.

A gasket 80 is provided between the lid unit 4 and the container body 2 and includes a base end supporting portion 81 and a contact portion 82.

The base end supporting portion 81 is seated within fitting groove 4A in the lid unit 4 side and has a shape almost trapezoidal in cross-section. On the inside of the upper surface of the base end supporting portion 81 is provided a seal piece 83 seated in an annular groove 84. The seal piece 83 extends upward and comes into contact with the lid unit 4 side to keep airtightness. The annular groove 84 is provided on the outer side of the seal piece 83 and absorbs elastic deformation of the seal piece 83.

The contact portion 82 is expanded from the base end supporting portion 81 into a flange shape. Bent lip portion 82A of the contact portion 82 is pressed by the lid unit 4, and the periphery thereby comes into contact with the container body 2.

Figure 27:
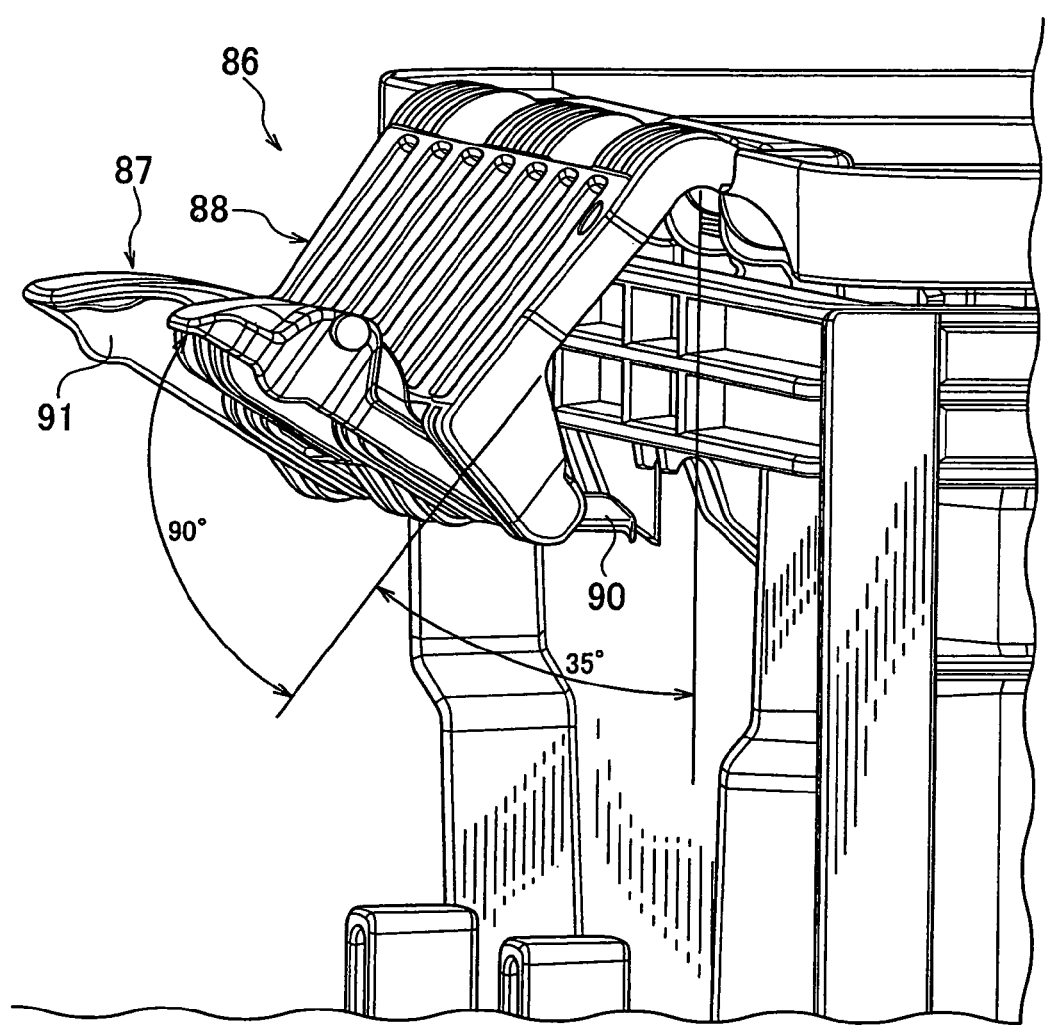
FIG. 27 is a perspective view of a latch mechanism.

A latch mechanism 86, which serves to fix the lid unit 4 to the container body 2, as shown in FIG. 27, includes a first arm 87 and a second arm 88. The first arm 87 fixes the lid unit 4 to the container body 2 by being directly locked by a receiving portion (not shown) on the container body 2. The second arm 88 is pivotally supported by the lid unit 4 and pivotally supports the first arm 87.

Figure 28:
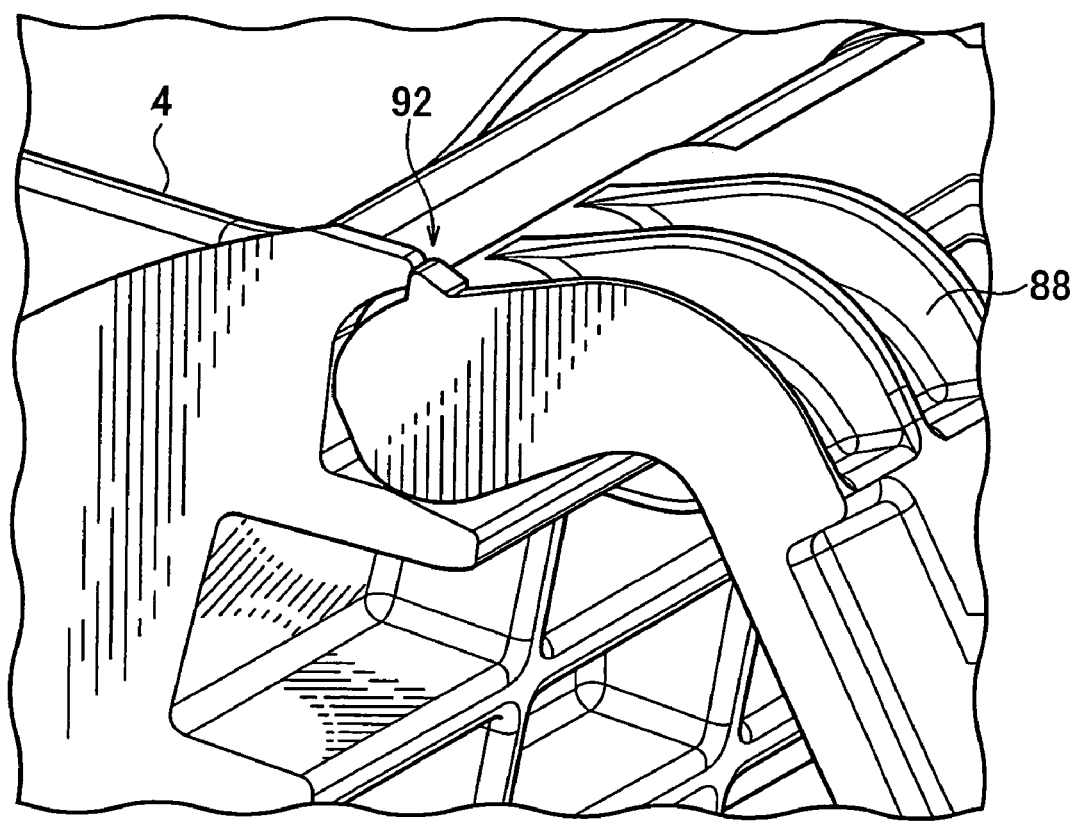
FIG. 28 is a perspective view of a stopper of the latch mechanism.

The first arm 87 has a locking pawl 90 and a grip 91. The locking pawl 90 is located at the base end and comes into contact with the receiving portion on the container body 2 to thereby fix the lid unit 4 to the container body 2. The grip 91 is a member for lifting the lid unit 4 and is formed at the tip of the first arm 87, in a shape which is easily gripped by hand. The first and second arms 87 and 88 are set in a position at a side of the lid unit 4 so that the grip 91 is easily gripped when the first and second arms 87 and 88 have been pivoted to their limit positions where the locking pawl 90 at the base end of the first arm 87 is not in contact with the container body 2. Specifically, in that limit position, the first arm 87 is open up to 90° with respect to the second arm 88 and the second arm 88 is open up to 35° with respect to the container body 2. The first arm 87 is supported at 90° when its tip is in contact, pivoted by the L-shaped second arm 88. The second arm 88 is supported at 35° by a stopper 92 (see FIG. 28).

Figure 24:
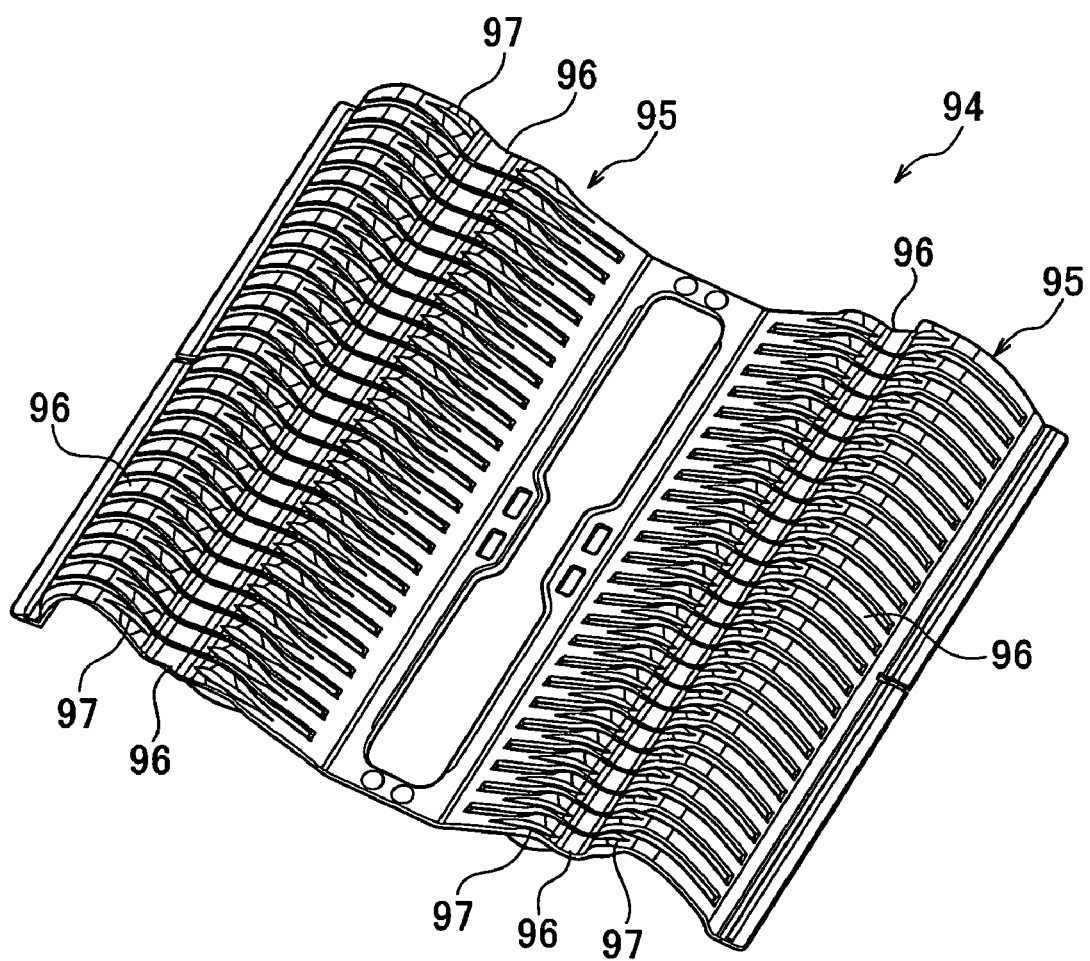
FIG. 24 is a perspective view of a thin plate pressing member.
Figure 25:
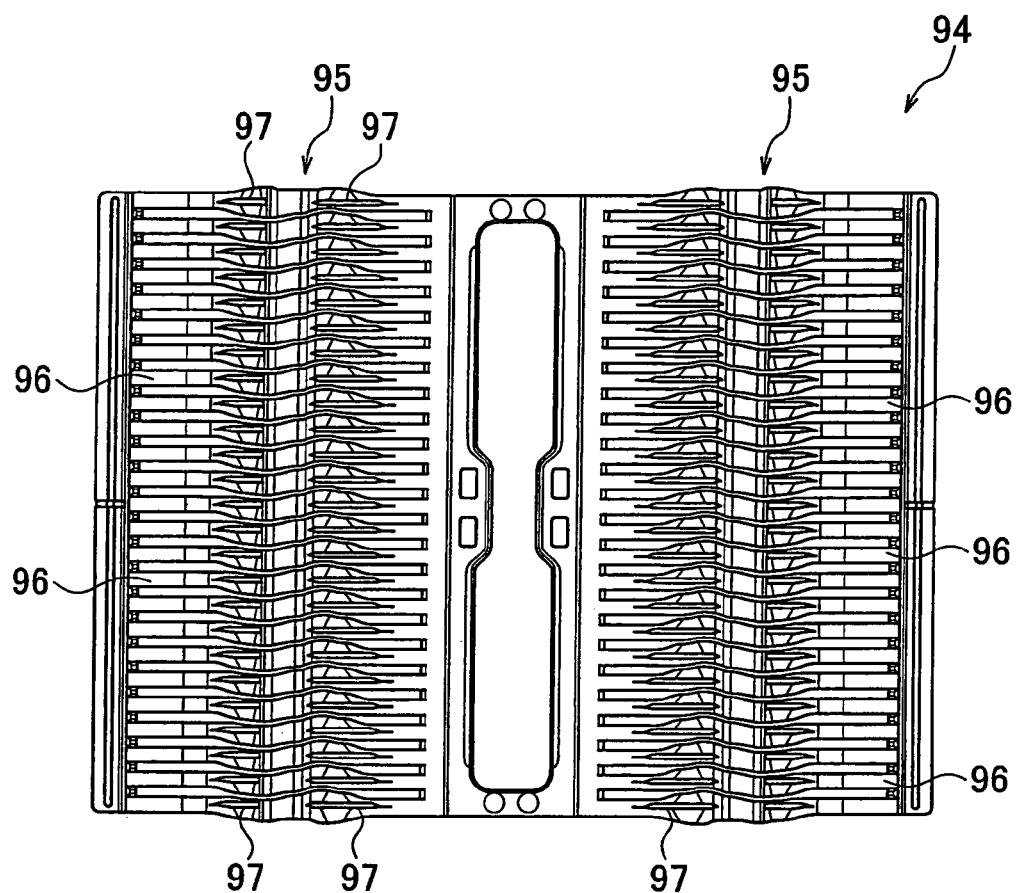
FIG. 25 is a planar view of the thin plate pressing member.
Figure 26:
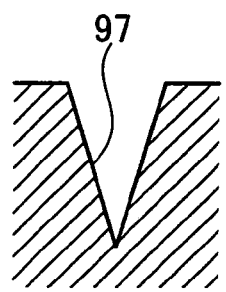
FIG. 26 is a cross-sectional view of a fitting groove in the thin plate pressing member.

On the back face of the lid unit 4 is a thin plate pressing member 94 (FIGS. 24, 25 and 26). The thin plate pressing member 94 serves to press and support the upper portions of the semiconductor wafers S housed in the container body 2 when the lid unit 4 is attached to the container body 2.

The thin plate pressing member 94 is formed in an almost rectangular shape as shown in FIGS. 24 to 26. Both longitudinal ends and the center portion of the thin plate pressing member 94 are fixed to the back face of the lid unit 4, and the portions between the both ends and the center portion serve as pressing portions 95. The pressing portion 95 is a member for elastically pressing and supporting the upper portion of the semiconductor wafer S and is formed of a number of pressing bands 96 arranged in parallel. The pressing band 96 is an elastic member which is formed so as to be curved downward. Further, the pressing band 96 presents a wavy shape in plan view (FIG. 25) along the periphery of the semiconductor wafer S to prevent the semiconductor wafer S from entering a gap between the pressing bands 96.

The shape of the pressing band 96, as viewed from the side, is an inverted mountain shape. In two apex positions of the mountain-shaped portion, fitting grooves 97 for supporting each semiconductor wafer S are provided at predetermined intervals. Each fitting groove 97 is formed at an acute angle so as to sandwich the periphery of the semiconductor wafer S (FIG. 26).

[Operation]

The thin plate supporting container 1 constructed as described above is used as follows.

In a state where a number of semiconductor wafers S have been placed in the container body 2 and the lid unit 4 is attached, the thin plate supporting container 1 is transported, for example, to a semiconductor fabricating factory. The lid unit 4 is detached from the thin plate supporting container 1 in the factory, a special lid unit for semiconductor fabricating is attached to the thin plate supporting container 1 and the closed container is carried to a fabricating process.

The upper portion of the slotted plate 3 is supported in the container body 2 by the upper fitting means 55 with the upper fitting lug 57 mated with the upper bracket 58 of the slotted plate 3. Accordingly, the upper portion of the slotted plate 3 is securely supported on the container body 2. Consequently, the slotted plate 3 does not swing and is securely supported, and positioning in the front/rear direction of the slotted plate 3 is provided. In this manner, deflection of the slotted plate 3 is reduced and the slotted plate 3 accurately positioned.

The lower portion of the slotted plate 3 is supported by the lower fitting means 56.

First, the slotted plate 3 is vertically positioned by the vertical positioning means 65. The lower end face of the lower plate 69 of the vertical positioning means 65 fits in the fitting notch 68A of the supporting bracket 68, thereby accurately vertically positioning of the slotted plate 3.

In this case, the notch 71 on the slotted plate 3 of the horizontal positioning means 66 seats on the horizontal positioning projection 72 on the container body 2, thereby positioning the slotted plate 3 in the horizontal direction.

Referring to FIG. 17, a front/rear positioning plate 73 of the front/rear positioning means 67 comes into contact with the lower portion of each of the side walls 2C and 2D of the container body 2 to position the slotted plate 3 in the front/rear direction.

At this time, the locking member 76 of the stopper 75 mates with the locking projection 77 to prevent the slotted plate 3 from dislodging upward.

The slotted plate 3 can be there by accurately positioned with the upper fitting means 55 and the lower fitting means 56 and easily fixed. For detaching the slotted plate 3, the locking member 76 is pulled away from the container body to move the slotted plate 3 upward thus enabling the slotted plate 3 to be easily detached.

Due to the shape of the plate elements 50 of the slotted plate 3, the semiconductor wafers S can be smoothly inserted/taken out of the container body 2 and can be prevented from coming into contact with the plate elements 50.

For detachment of the top flange 5, the supporting bar 39 of the front-side locking pawl 34B is lifted with the user's finger to disengage the contact portion 38 from the locking projection 33, and the top flange 5 is slid to the front side and easily detached.

Since the supporting portion 30 and the sliding portion 31 widen from the front side to the inner side, the sliding portion 31 can be easily mated with the supporting portion 30.

Further, since the top flange 5 is supported by the fitting rails 29A and the receiving rails 29B, the top flange 5 can be smoothly moved and easily attached/detached.

In the event of a strong force in the direction tending to dislodge the top flange 5, i.e. an abnormal shock due to a fall or the like, the supporting bar 39 prevents the top flange 5 from coming off. Since the contact 38 of the front-side locking pawl 34B is strongly pressed against the locking projection 33 even when a strong force is applied to the flange 5 due to a shock, the contact portion 38 does not release from the locking projection 33, and the supporting bar portion 39 prevents the top flange 5 from coming off.

To attach the lid unit 4 to the container body 2, the user grips the grip 91 of the first arm 87 to lift the lid unit 4 and place it on the container body 2. At this time, since the first arm 87 is set at 90° with respect to the second arm 88 and the second arm 88 is set at 35° with respect to the container body 2, the grip 91 is positioned on a side of the lid unit 4 where the first and second arms 87 and 88 are pivoted to their limits, and the grip 91 is in a position at which the user can easily lift the lid unit 4. Then, still gripping the grip 91, the grip 91 is pushed downward, whereby the locking pawl 90 is brought into contact with the container body 2 and the lid unit 4 is fixed to the container body 2.

To detach the lid unit from the container body, a user grips the grips 91 of the first arms 87 and pulls the grips 91 away from the container body 2. The locking pawl 90 in the base end portion of the first arm 87 is thereby released from engagement with the container body 2 and the lid unit 4 is disengaged. Because the locking pawl 90 is pivoted as the second arm 88 swings the first arm 87 to its limit position, even when the user lifts the lid unit 4 up, the locking pawl 90 does not come into contact with the container body 2, and the lid unit 4 can be easily detached. Because each semiconductor wafer S is fit in a fitting groove 97 formed at an acute angle, the periphery of the semiconductor wafer S is securely supported and, even when a strong shock is received by the thin plate supporting container 1, the semiconductor wafer S is prevented from rotation and shifting.

Since the pressing bands 96 are formed in a wavy shape along the peripheries of the semiconductor wafers S, even if a semiconductor wafer S comes out from the fitting groove 97, it will not enter a gap between the pressing bands 96.

Since the V-shaped groove plate piece 15 is detachably mounted on the supporting stand 16 of the body positioning means 11, irrespective of the material of the container body 2, the V-shaped groove plate piece 15 can be made of a material on which the fitting projection of the mounting stand in the semiconductor fabricating process, easily slides. When the fitting projection of the mounting stand used in the semiconductor fabricating process is inserted in the fitting groove 13 of the body positioning means 11 guided by the V-shaped groove plate piece 15 made of a material having low surface frictional resistance, smooth sliding is achieved and the thin plate supporting container 1 can be accurately positioned.

Since the V-shaped groove plate piece 15 is detachable from the supporting stand 16, it can be easily replaced in accordance with the material of the projection which it receives.

[Modifications]

(1) Although the gasket 80 (FIG. 29) is provided on the lid unit 4 side in the foregoing embodiment, it can be provided on the container body 2 side.

(2) Although four upper fitting lugs 57 (FIG. 20) are provided in the described embodiment, it is sufficient to provide two upper fitting lugs 57 at opposing ends. The number of the upper fitting lugs 57 may be varied according to the size, required strength, and the like.

(3) Although two sliding and supporting means 27 (FIG. 12) are provided in the foregoing embodiment, three or more sliding and supporting means may be provided. Although two guide rails 29 are provided, one guide rail 29 or three or more guide rails 29 may be provided.

Figure 4:
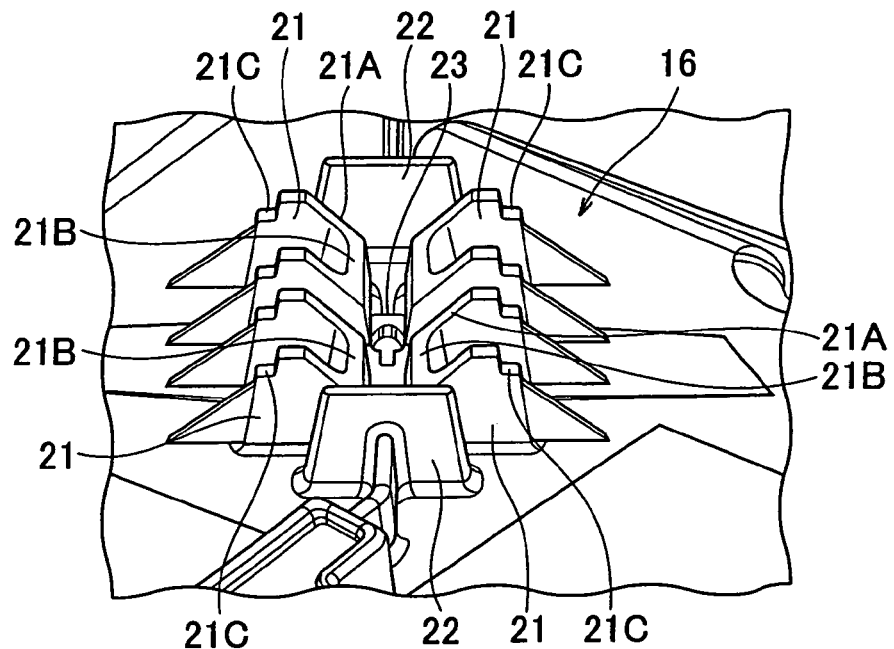
FIG. 4 is a perspective view of a supporting stand of a body positioning element.
Figure 5:
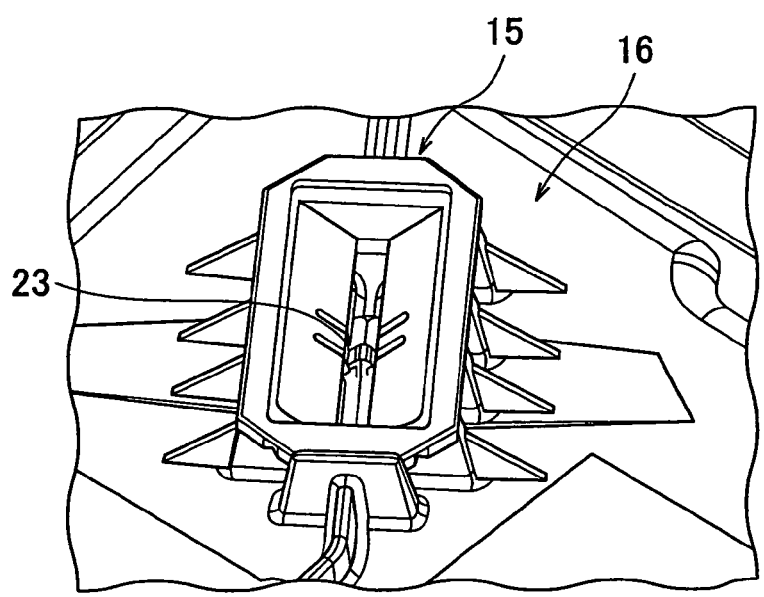
FIG. 5 is a perspective view showing of a V-shaped groove plate attached to the supporting stand.

(4) Although the supporting stand 16 (FIG. 4) of the body positioning means 11 is formed as part of the fitting groove 13 in the foregoing embodiment, the supporting stand 16 may be formed as the whole fitting groove 13.

What is claimed is:

1. A thin plate supporting container comprising:
    a container body for housing therein a plurality of thin plates,
    a lid unit for closing the container body,
    slotted plates fixed on side walls facing each other in the container body and supporting the thin plates housed on the inside from opposing sides, and
    an attaching/detaching mechanism for detachably attaching, to the container body, at least one of a top flange for engagement by a container carrying mechanism and a handle to be held by the user, wherein the attaching/detaching mechanism includes sliding and supporting means for slidably engaging the container body, as a first member, with the top flange or handle as a second member, and locking means for locking the sliding and supporting means,
    wherein the sliding and supporting means includes a supporting portion fixed on one of members and a sliding portion which is fixed on the other member and is to be inserted, in an insertion direction, into the supporting portion from a front side,
    wherein the locking means includes a locking projection fixed on one of the members, and a locking pawl fixed on the other of the members, and
    wherein the locking pawl includes a supporting bar, extending in a direction opposite the insertion direction, from the other member toward the front side, and extending toward the container body, and further includes a catch which is supported on the supporting bar and which mates with the locking projection to secure the second member to the first member.

2. The thin plate supporting container according to claim 1, wherein the catch of the locking pawl is fixed to a distal end of the supporting bar opposite a base end portion of the supporting bar.

3. The thin plate supporting container according to claim 1, wherein two supporting portions and two sliding portions of the sliding and supporting means are arranged spaced apart, and each of the spacings between the supporting portions and between the sliding portions is smaller on the front side than on an inner side, opposite the front side.

4. The thin plate supporting container according to claim 1, further comprising spaced guide rails on the one member for guiding the sliding engagement of the two members by the sliding and support means, the guide rails oriented to extend in the sliding direction and positioning the second member in a direction orthogonal to the sliding direction.

5. The thin plate supporting container according to claim 1, wherein the first member has a planar side surface, wherein the second member has a planar flange portion parallel to the planar side surface when the second member is secured to the first member, wherein the locking projection is formed on and extends from the planar side surface and presents a contact surface perpendicular to the planar side surface and to the planar flange portion and wherein the catch comes into contact with the projection at the perpendicular contact surface in locking the sliding and supporting means.

6. The thin plate supporting container according to claim 5, wherein the second member is a top flange having a central portion and the planar flange portion surrounding the central portion, and wherein the supporting bar has a base end fixed to the central portion and extends straight from the base end perpendicular to an edge of the planar flange portion.

7. The thin plate supporting container according to claim 1, wherein the second member is a top flange having a central portion and a planar flange portion surrounding the central portion, and wherein the supporting bar has a base end fixed to the central portion and extends straight from the base end perpendicular to an edge of the planar flange portion.

8. The thin plate supporting container according to claim 7, wherein the flange portion has a slot opening, extending therethrough from the central portion to the edge, the supporting bar being located within said slot opening.

9. The thin plate supporting container according to claim 6, wherein the flange portion has a slot opening, extending therethrough from the central portion to the edge, the supporting bar being located within said slot opening.

10. The thin plate supporting container according to claim 4, wherein the locking projection is centrally located between ends of the guide rails.

* * * * *